(12) United States Patent
Sang et al.

(10) Patent No.: US 12,265,296 B2
(45) Date of Patent: Apr. 1, 2025

(54) DRIVING BACKPLANE, MANUFACTURING METHOD THEREOF AND DISPLAY PANEL

(71) Applicants: Hefei Xinsheng Optoelectronics Technology Co., Ltd., Anhui (CN); BOE Technology Group Co., Ltd., Beijing (CN)

(72) Inventors: Huayu Sang, Beijing (CN); Xiaodong Xie, Beijing (CN); Min He, Beijing (CN); Xue Zhao, Beijing (CN); Tianyu Zhang, Beijing (CN); Tengfei Zhong, Beijing (CN); Xinxiu Zhang, Beijing (CN); Bin Pang, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 790 days.

(21) Appl. No.: 17/440,277

(22) PCT Filed: Jan. 22, 2021

(86) PCT No.: PCT/CN2021/073340
§ 371 (c)(1),
(2) Date: Sep. 17, 2021

(87) PCT Pub. No.: WO2022/088534
PCT Pub. Date: May 5, 2022

(65) Prior Publication Data
US 2022/0350199 A1    Nov. 3, 2022

(30) Foreign Application Priority Data
Oct. 30, 2020  (CN) .......................... 202011197976.4

(51) Int. Cl.
*G02F 1/13357* (2006.01)
*H01L 25/075* (2006.01)
*H01L 33/62* (2010.01)

(52) U.S. Cl.
CPC .... *G02F 1/133603* (2013.01); *H01L 25/0753* (2013.01); *H01L 33/62* (2013.01)

(58) Field of Classification Search
CPC ......... G02F 1/133603; G02F 1/133612; G02F 1/13306; G02F 1/13452; H01L 25/0753; H01L 33/62; G03F 7/00
See application file for complete search history.

(56) References Cited

U.S. PATENT DOCUMENTS 8,552,555 B2 * 10/2013  Suzuki ............... G02F 1/13458
                                                        257/737
8,988,623 B2 *  3/2015  Koyama ............. G02F 1/13439
                                                        349/149
(Continued)

FOREIGN PATENT DOCUMENTS

CN        202631948 U    12/2012
CN        109713020 A     5/2019
(Continued)

*Primary Examiner* — Kevin Quarterman
(74) *Attorney, Agent, or Firm* — Nath, Goldberg & Meyer; Joshua B. Goldberg

(57) ABSTRACT

An embodiment of the present disclosure provides a driving backplane, which includes: a base substrate; a first conductive layer on the base substrate; a first planarization layer on the base substrate and in a region outside a pattern of the first conductive layer; a second planarization layer on a side of the first conductive layer and the first planarization layer distal to the base substrate; and a second conductive layer on a side of the second planarization layer distal to the base substrate, wherein an orthographic projection of the first
(Continued)

conductive layer on the base substrate partially overlaps with an orthographic projection of the second conductive layer on the base substrate.

19 Claims, 12 Drawing Sheets

(56) References Cited

U.S. PATENT DOCUMENTS

2020/0219863 A1\* 7/2020 Bibl .................. H01L 33/0008
2020/0335467 A1 10/2020 Suzuki

FOREIGN PATENT DOCUMENTS

| | | |
|---|---|---|
| CN | 109873023 A | 6/2019 |
| CN | 109904211 A | 6/2019 |
| CN | 110047898 A | 7/2019 |
| CN | 111146215 A | 5/2020 |

\* cited by examiner

31

DRIVING BACKPLANE, MANUFACTURING METHOD THEREOF AND DISPLAY PANEL

This is a National Phase Application filed under 35 U.S.C. 371 as a national stage of PCT/CN2021/073340, filed Jan. 22, 2021, an application claiming the benefit of Chinese Application No. CN202011197976.4, filed Oct. 30, 2020, the content of each of which is hereby incorporated by reference in its entirety.

TECHNICAL FIELD

Embodiments of the present disclosure relate to the technical field of display, and in particular to a driving backplane and a manufacturing method thereof, and a display panel.

BACKGROUND

For a large-sized Liquid Crystal Display (LCD), the light-emitting efficiency of the side light source (or edge type, or lateral light source) scheme is difficult to meet the display requirement, and thus the direct light source scheme is generally employed in the large-sized LCD.

Since a Mini light emitting diode (Mini LED) has advantages such as lightness, thinness, and a high contrast, the Mini LED as a backlight becomes the mainstream direct light source scheme.

SUMMARY

Embodiments of the present disclosure provide a driving backplane and manufacture method thereof and a display panel.

As a first aspect, a driving backplane is provided in an embodiment of the present disclosure. The driving backplane includes a base substrate; a first conductive layer on the base substrate; a first planarization layer in a region of the base substrate outside a pattern of the first conductive layer; a second planarization layer on a side of the first conductive layer and the first planarization layer distal to the base substrate and a second conductive layer on a side of the second planarization layer distal to the base substrate, wherein an orthographic projection of the first conductive layer on the base substrate partially overlaps with an orthographic projection of the second conductive layer on the base substrate.

In some embodiments, a pattern of an orthographic projection of the first planarization layer on the base substrate is complementary to a pattern of the orthographic projection of the first conductive layer on the base substrate.

In some embodiments, a difference between a thickness of the first planarization layer and a thickness of the first conductive layer is less than 1 μm.

In some embodiments, the thickness of the first planarization layer is less than the thickness of the first conductive layer.

In some embodiments, the first planarization layer has the same thickness as the thickness of the first conductive layer.

In some embodiments, the first planarization layer has a thickness in a range from 1.8 μm to 7 μm.

In some embodiments, the first planarization layer comprises a photoresist material, and photosensitivity of the photoresist material of the first planarization layer is opposite to photosensitivity of a photoresist material used for forming the first conductive layer.

In some embodiments, the first planarization layer comprises a photoresist material, and photosensitivity of the photoresist material of the first planarization layer is the same as photosensitivity of a photoresist material used for forming the first conductive layer.

In some embodiments, the first planarization layer comprises an organic insulation material or an inorganic insulation material.

In some embodiments, the driving backplane further includes a first insulation layer between the first planarization layer and the first conductive layer.

In some embodiments, the second planarization layer includes a plurality of first via holes, and a pattern of the second conductive layer is electrically coupled to the pattern of the first conductive layer through the plurality of first via holes.

In some embodiments, the driving backplane further includes: a third planarization layer on a side of the second conductive layer distal to the base substrate; and a second insulation layer between the second conductive layer and the third planarization layer. The first insulation layer includes a plurality of second via holes corresponding to the plurality of first via holes respectively. The third planarization layer includes a plurality of third via holes. The second insulation layer includes a plurality of fourth via holes corresponding to the plurality of third via holes respectively.

In some embodiments, the driving backplane further includes: a first protective layer between the first conductive layer and the second conductive layer, and a second protective layer on a side of the second conductive layer distal to the base substrate. A pattern of the first protective layer is consistent with the pattern of the first conductive layer, and a pattern of the second protective layer is consistent with a pattern of the second conductive layer.

As a second aspect of the present disclosure, a display panel including above driving backplane is provided in an embodiment of the present disclosure.

As a third aspect of the present disclosure, a method for manufacturing above driving backplane is provided in an embodiment of the present disclosure. The method includes: forming a pattern of a first conductive layer on a base substrate; forming a pattern of a first planarization layer in a region outside the pattern of the first conductive layer; forming a pattern of a second planarization layer on the first conductive layer and the first planarization layer; and forming a pattern of a second conductive layer on the second planarization layer, wherein an orthographic projection of the first conductive layer on the base substrate partially overlaps an orthographic projection of the second conductive layer on the base substrate.

In some embodiments, the first planarization layer and the first conductive layer are formed by using a same mask, and the first planarization layer and the first conductive layer are formed by using photoresist materials with different properties.

In some embodiments, forming the pattern of the first conductive layer includes: depositing a first metal film layer on the base substrate; coating a positive photoresist film, performing exposure and development processes on the positive photoresist film by using a mask plate to remove the positive photoresist film not shielded by the mask plate and remain the positive photoresist film shielded by the mask plate; and etching the first metal film layer not covered by the positive photoresist film to form the pattern of the first conductive layer; wherein the pattern of the first conductive layer is consistent with a pattern of the mask plate.

Forming the pattern of the first planarization layer includes: coating a negative photoresist film on the base substrate on which the first conductive layer is formed; and performing exposure and development processes on the negative photoresist film by using the mask plate used for forming the first conductive layer to remove the negative photoresist film shielded by the mask plate and remain the negative photoresist film not shielded by the mask plate, so as to form the pattern of the first planarization layer; wherein the pattern of the first planarization layer is a pattern of the reserved negative photoresist film not shielded by the mask plate, and an orthographic projection of the first planarization layer on the base substrate is complementary with an orthographic projection of the first conductive layer on the base substrate.

In some embodiments, forming the pattern of the first conductive layer on the base substrate includes: forming a plating seed layer on the base substrate; forming a photoresist layer on the plating seed layer; patterning the photoresist layer to obtain a pattern of the photoresist layer complementary to the pattern of the first conductive layer to be formed; and forming the pattern of the first conductive layer through an electroplating process by using the pattern of the photoresist layer as a mask.

Forming the pattern of the first planarization layer in the region outside the pattern of the first conductive layer includes forming the first planarization layer on the first conductive layer by using a photoresist material having the same photosensitivity as the photoresist layer; and patterning the first planarization layer by using a same mask plate used for forming the pattern of the photoresist layer.

In some embodiments, forming the pattern of the first conductive layer on the base substrate includes: forming a plating seed layer on the base substrate; forming a photoresist layer on the plating seed layer; patterning the photoresist layer to obtain a pattern of the photoresist layer consistent with the pattern of the first conductive layer to be formed; patterning the plating seed layer to obtain a pattern of the plating seed layer; and forming the first conductive layer through an electroplating process on the base substrate.

Forming the pattern of the first planarization layer in the region outside the pattern of the first conductive layer includes: forming the first planarization layer on the first conductive layer by using a photoresist material having photosensitivity opposite to photosensitivity of a material of the first photoresist; and patterning the first planarization layer by using a same mask plate used for forming the pattern of the photoresist layer.

In some embodiments, forming the pattern of the second planarization layer includes: patterning the second planarization layer to obtain a plurality of first via holes, the pattern of the second conductive layer being electrically coupled to the pattern of the first conductive layer through the plurality of first via holes.

After forming the pattern of the first conductive layer on the base substrate and before forming the pattern of the first planarization layer in the region outside the pattern of the first conductive layer, the method further includes: forming a first insulation layer on the first conductive layer.

After patterning the second planarization layer and before forming the pattern of the second conductive layer on the second planarization layer, the method further includes: patterning the first insulation layer by using the pattern of the second planarization layer as a mask to obtain a plurality of second via holes corresponding to the plurality of first via holes respectively.

In some embodiments, after forming the pattern of the second conductive layer on the second planarization layer, the method further includes: forming a second insulation layer on the second conductive layer; forming a third planarization layer on the second insulation layer; patterning the third planarization layer to obtain a plurality of third via holes; and patterning the second insulation layer by using the third planarization layer as a mask to obtain a plurality of fourth via holes corresponding to the plurality of third via holes respectively.

In some embodiments, after forming the pattern of the first conductive layer on the base substrate and before forming the pattern of the first planarization layer in the region outside the pattern of the first conductive layer, the method further includes: forming a pattern of a first protective layer on the first conductive layer, the pattern of the first protective layer being consistent with the pattern of the first conductive layer;

After forming the pattern of the second conductive layer on the second planarization layer, the method further includes: forming a pattern of a second protective layer on the second conductive layer, the pattern of the second protective layer being consistent with the pattern of the second conductive layer.

In some embodiments, the forming the plating seed layer on the base substrate includes: forming the plating seed layer on the base substrate; and patterning the plating seed layer such that the patterned plating seed layer includes a plurality of first alignment marks and a plurality of second alignment marks.

Patterning the photoresist layer includes: providing a mask plate comprising a plurality of third alignment marks respectively corresponding to the plurality of first alignment marks, and a plurality of fourth alignment marks respectively corresponding to the plurality of second alignment marks; and performing an exposure process on the photoresist layer by shielding the photoresist layer with the mask plate, wherein during the exposure process on the photoresist layer, the plurality of fourth alignment marks of the mask plate are shielded by a shield plate, and the plurality of third alignment marks of the mask plate are aligned with the plurality of first alignment marks of the plating seed layer.

Patterning the first planarization layer by using the same mask plate used for forming the pattern of the photoresist layer includes performing an exposure process on the first planarization layer by shielding the first planarization layer with the mask plate, wherein during the exposure process on the first planarization layer, the shield plate is removed to expose the plurality of fourth alignment marks of the mask plate, and the plurality of fourth alignment marks of the mask plate are aligned with the plurality of second alignment marks of the plating seed layer.

BRIEF DESCRIPTION OF THE DRAWINGS

The accompanying drawings, which provide a further understanding of the present disclosure and constitute a part of the specification, are used in conjunction with the following specific embodiments to explain the present disclosure, but are not intended to limit the present disclosure. The above and other features and advantages will become more apparent to those skilled in the art by illustrating in detail exemplary embodiments thereof with reference to the attached drawings, in which.

Figure 1:
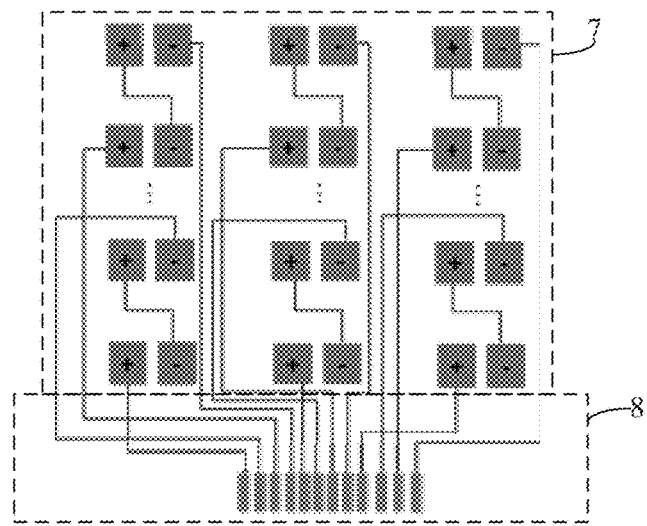
FIG. 1 is a circuit and routing diagram of a Mini LED on a driving backplane.

The reference numbers are:

1. a base substrate; 2. a first conductive layer; 3. a second planarization layer; 4. a second conductive layer; 5. a first planarization layer; 6. a first insulation layer; 7. a line non-converging region; 8. a line binding-converging region; 10. a lamp region; 11. a bonding terminal; 13. a planarization layer; 14. a buffer layer; 15. a protective layer; 16, a third planarization layer; 17. a driving backplane; 18. a liquid crystal cell; 181. an array substrate; 182. a color filter substrate; 183. a liquid crystal; 19. a first copper layer; 20. a second copper layer; 101. a power signal line; 102. a ground line; 401. a lamp bead; 21. a second insulation layer; 22. a first protective layer; 23. a second protective layer; 31. a plating seed layer; and 32. a photoresist layer.

DETAILED DESCRIPTION

In order to make those skilled in the art better understand the technical solutions of the embodiments of the present disclosure, the driving backplane and the manufacturing method thereof, and the display panel provided in the embodiments of the present disclosure will be illustrated in further detail with reference to the accompanying drawings and the detailed description.

The embodiments of the present disclosure will be described more fully hereinafter with reference to the accompanying drawings, but the embodiments shown may be embodied in different forms and should not be construed as limited to the embodiments set forth herein. Rather, these embodiments are provided so that the present disclosure will be thorough and complete, and will fully convey the scope of the present disclosure to those skilled in the art.

The disclosed embodiments are not limited to the embodiments shown in the drawings, but include modifications of configurations formed based on a manufacturing process. Thus, the regions shown in the drawings have schematic properties, and the shapes of the regions shown in the drawings show specific shapes of the regions, but are not intended to be limited.

In a display solution of a large-sized Liquid Crystal Display (LCD), a light-emitting efficiency of the lateral light source or side light source scheme hardly meets the display requirement, and thus a direct light source scheme is generally employed in the large-sized LCD. Among direct light source schemes, since the Mini Light Emitting Diode (Mini LED) backlight scheme has advantages such as lightness, thinness, and a high contrast, the Mini LED as a backlight becomes the mainstream in the direct light source schemes.

Figure 2:
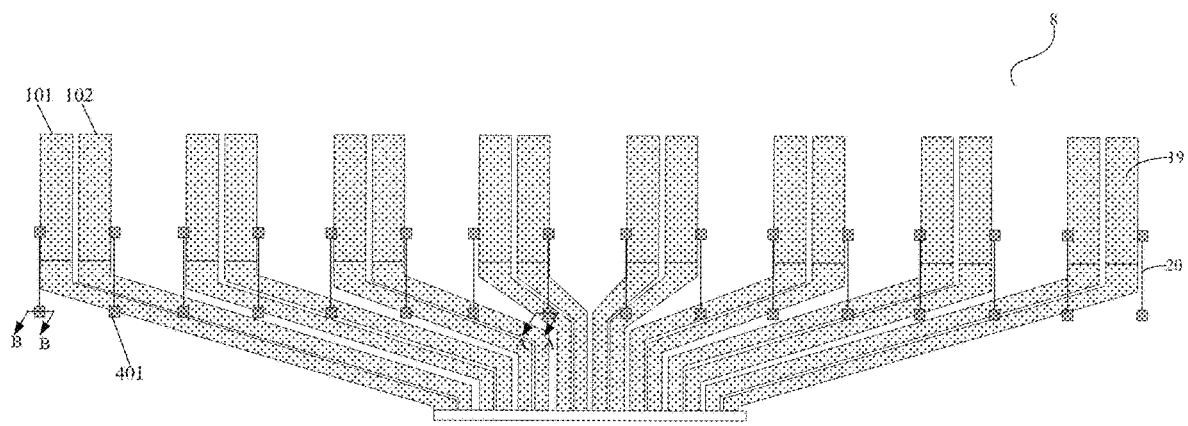
FIG. 2 is a schematic top view showing a wiring in the line binding-converging region on the driving backplane according to the disclosed art.

Referring to FIGS. 1 and 2, it is found that during the manufacture process of the Mini LED driving backplane, an unavoidable overlapping region exists between orthographic projections of metal lines on the driving backplane, and therefore two metal copper (Cu) layers overlapping with each other in the overlapping region needs to be insulated from each other. In the design process of the Mini LED driving backplane, since the Mini LED driving backplane has a large overall size, the metal lines in the upper and lower regions (i.e., a region where the Mini LED lamp beads are arranged, and a peripheral line binding region) of the Mini LED driving backplane have different voltage drops, problems such as non-uniform display are easy to occur. Therefore, it is required that the metal lines of the Mini LED driving backplane extending from the upper region (i.e., a line non-converging region 7) to the lower region (i.e., a line binding-converging region 8) has a small resistance. In order to satisfy the resistance requirement of metal lines in a limited space, a first copper layer 19 of the Mini LED driving backplane usually has a large thickness, up to in a range from 1.8 μm to 7 μm; and a second copper layer 20 generally has a thickness of 0.9 μm, since the second copper layer 20 only needs to be coupled to the lamp bead 401 and a driver chip in general and thus has a smaller resistance requirement than the first copper layer 19. The thickness of the first copper layer 19 is different from the thickness of the second copper layer 20. Therefore, on one hand, a height step/height difference exits at a position where the first copper layer 19 overlaps with the second copper layer 20, relative to a position where only the second copper layer 20 is located, and the risk of line breakage of the second copper layer 20 exists duo to the height step/height difference (e.g., the line breakage easily occurs if a thin line climbs at the height step); and on the other hand, an uneven welding surface of a driver chip pad electrically coupled to the driver chip and an uneven welding surface of a lamp bead pad electrically coupled to the lamp bead 401, are formed. During the process of die bond, the driver chip and the second copper layer 20, and the lamp beads 401 and the second copper layer 20, may be poor welded due to uneven welding surfaces, thereby resulting in a poor display.

Referring to FIG. 2, a plurality of signal lines on the driving backplane includes: a plurality of power signal lines 101 and a plurality of ground lines 102. The driving backplane may further include: a plurality pair of lamp bead pads bonded and coupled to the lamp beads 401. One of the paired lamp bead pads is electrically coupled to the power signal line 101, and the other of the paired lamp bead pads is electrically coupled to the ground line 102, so that the power can be supplied to the lamp beads 401 through the power signal line 101 and the ground line 102. Since both of the power signal lines 101 and the ground lines 102 extend from the line non-converging region 7 to the line binding-converging region 8 of the driving backplane and have a long routing distance, the power signal lines 101 and the ground lines 102 are made of the first copper layer 19 with a relatively large thickness. Since a connection line coupled to the lamp beads, a connection line coupled to the driver chip, and a connection line for connecting the lamp beads to the driver chip have a short routing distance, the connection line coupled to the lamp beads, the connection line coupled to the driver chip, and the connection line for connecting the lamp beads to the driver chip are made of the second copper layer 20 with a relatively small thickness.

Figure 3:
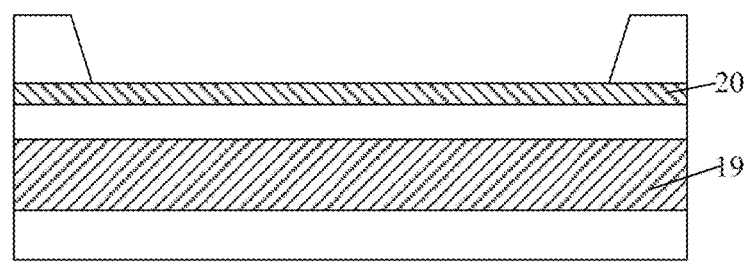
FIG. 3 is a schematic cross-sectional view showing a structure of the driving backplane taken along a section line AA in FIG. 2.
Figure 4:
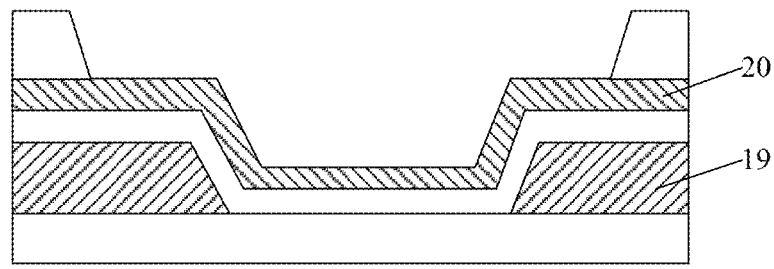
FIG. 4 is a schematic cross-sectional view showing a structure of the driving backplane taken along a section line BB in FIG. 2.

Referring to FIG. 2, due to the dense wiring in the line binding-converging region 8 of the driving backplane, not only there are many regions where first copper layer 19 overlaps with the second copper layer 20, but also the line arrangement in the regions is very irregular. The wiring below the driver chip and the lamp beads is not complete even distributed. Refer to FIG. 3 and FIG. 4, a portion of the first copper layer 19 under the lamp bead 401 or under the driver chip may be missing, and the first copper layer 19 cannot cover the entire region directly under the lamp bead pad or under the driver chip pad. A height difference about 2 μm to 3 μm is formed between a layer structure in a region without the first copper layer 19 and a layer structure in a region in which both of the first copper layer 19 and the second copper layer 20 are disposed, and the height difference cannot be levelled by an insulation layer. Under this condition, a lamp bead pad or a driver chip pad under which the first copper layer 19 is absent is easy to tilt, thereby resulting in poor welding when the lamp bead or the driver chip is weld.

Figure 5:
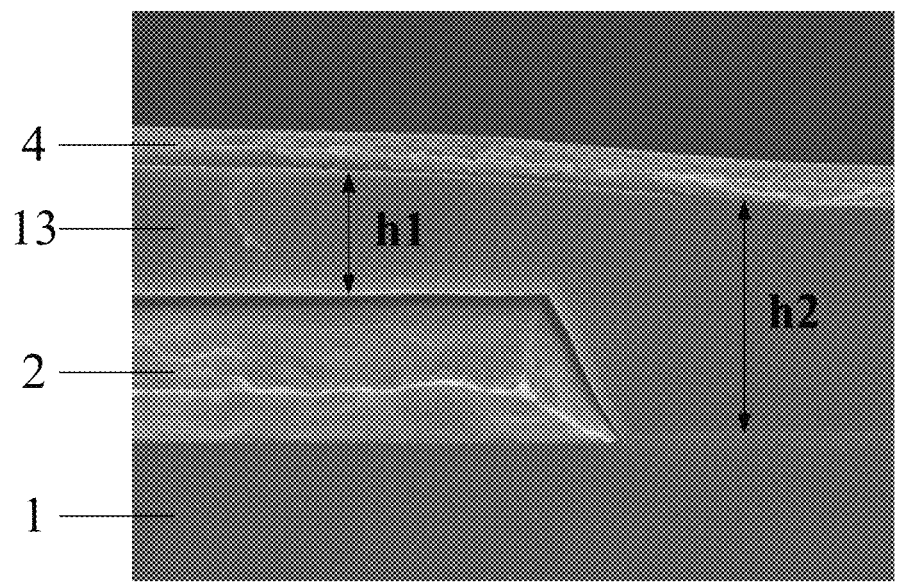
FIG. 5 is a scanning electron microscope image showing a driving backplane according to the related art.

In addition, in the related art, in order to improve the performance of the Mini LED display, the driving resistance of the driving backplane needs to be decreased. FIG. 5 is a scanning electron microscope image showing a driving backplane according to the related art. As shown in FIG. 5, the driving backplane includes: a base substrate 1, a first conductive layer 2, a second conductive layer 4 and a planarization layer 13. The second conductive layer 4 is coupled to the first conductive layer 2 through a via hole (not shown in the figure) in the planarization layer 13. In order to decrease the driving resistance of the driving backplane, the thickness of the first conductive layer 2 needs to be increased. For example, in order to decrease the sheet resistance of the first conductive layer 2 to less than 0.002Ω/□, the thickness of the first conductive layer 2 needs to be greater than 7 μm. In order to cover the first conductive layer 2 and ensure that the first conductive layer 2 and the second conductive layer 4 are insulated from each other at positions other than the via hole, the thickness of the planarization layer 13 needs to be increased.

With continued reference to FIG. 5, since the pattern of the first conductive layer 2 causes a large height difference, and a material of the planarization layer 13 has a self-leveling property, a difference between a thickness h1 of the planarization layer 13 on the pattern of the first conductive layer 2 and a thickness h2 of the planarization layer 13 not on the pattern of the first conductive layer 2 is large (i.e., about 2 mm), resulting in a poor uniformity of the thickness of the planarization layer 13. Moreover, due to the poor uniformity of the thickness of the planarization layer 13, during the manufacturing process, the via hole formed at the position of the planarization layer 13 with a larger thickness deviates greatly from the design value under the same exposure time, and even the via hole penetrating through the planarization layer 13 cannot be formed, thereby affecting the coupling effect between the first conductive layer 2 and the second conductive layer 4. In addition, in the related art, in order to form a via hole satisfying the design requirement in the planarization layer 13, two pattern processes are performed on the planarization layer 13. One of the two pattern processes is to form a large via hole at a position of the planarization layer 13 with a larger thickness, and the other of the two pattern processes is to form a small via hole at a position of the planarization layer 13 with a smaller thickness, which complicates the process steps and increases the manufacture cost.

The implementations of the driving backplane and manufacturing method thereof, and the display panel provided by the embodiments of the present disclosure, will be described in detail below in combination with the accompanying drawings. The thickness and shape of each of the film layers in the drawings do not reflect the true proportion and are only to schematically illustrate the contents of the present disclosure.

Figure 6:
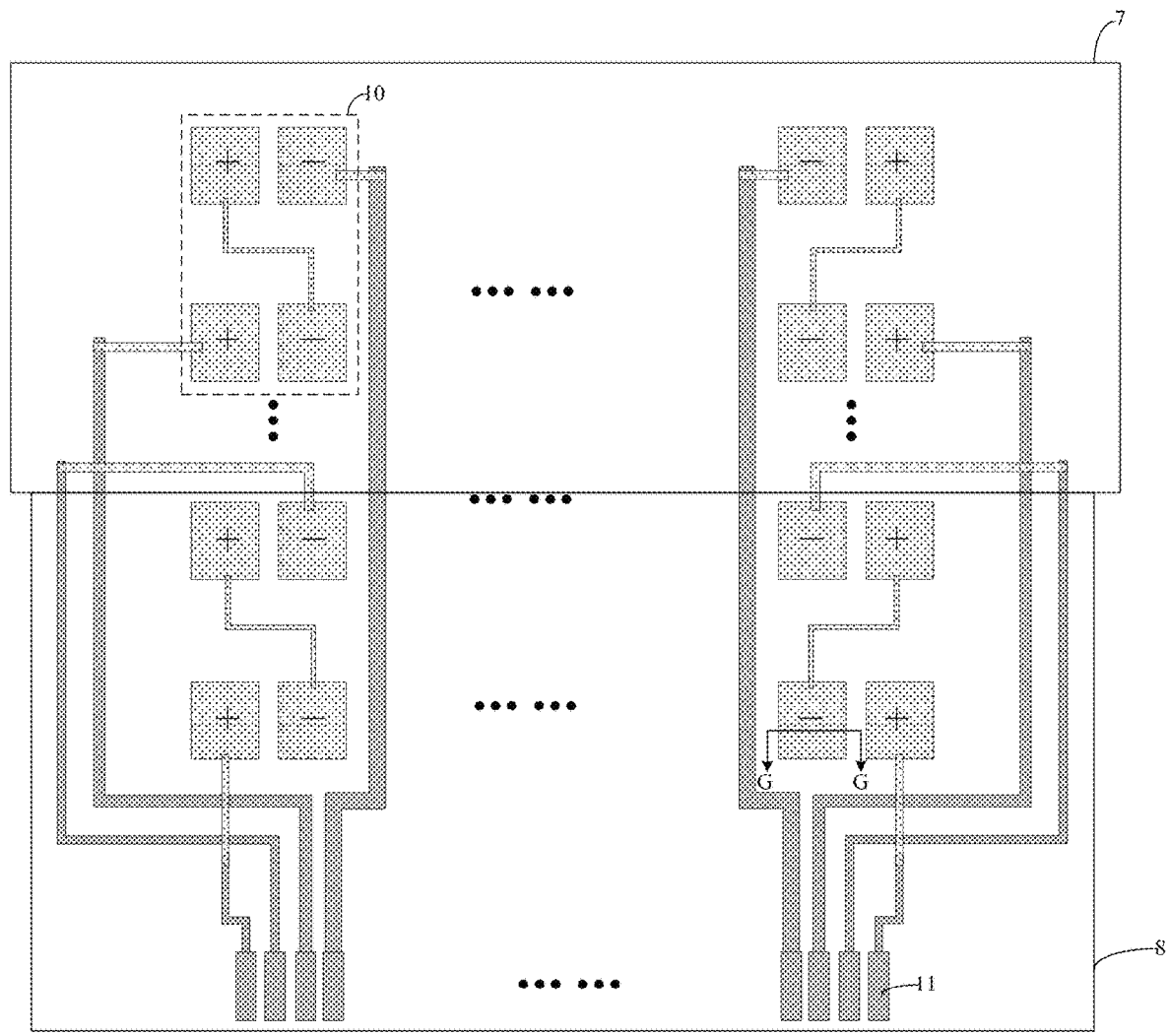
FIG. 6 is a schematic plan view showing a driving backplane according to an embodiment of the present disclosure.
Figure 7:
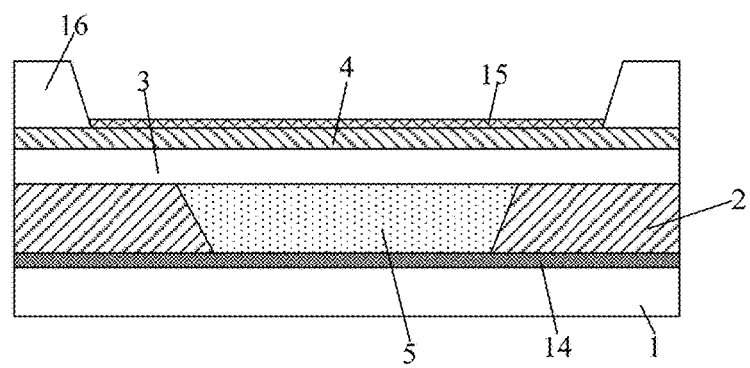
FIG. 7 is a schematic cross-sectional view showing a structure of the driving backplane taken along a section line GG in FIG. 6.

In order to solve the problems such as the wire breakage and poor welding of the pad of the Mini LED driving backplane due to the missing of the first copper layer, an embodiment of the present disclosure provides a driving backplane. As shown in FIGS. 6 and 7, the driving backplane includes a base substrate 1, a first conductive layer 2 located on the base substrate 1; a first planarization layer 5 located in a region of the base substrate 1 outside a pattern of the first conductive layer 2; a second planarization layer 3 on a side of the first conductive layer 2 and the first planarization layer 5 distal to the base substrate 1; and a second conductive layer 4 on a side of the second planarization layer 3 distal to the base substrate 1. An orthographic projection of the first conductive layer 2 on the base substrate 1 partially overlaps with an orthographic projection of the second conductive layer 4 on the base substrate 1.

In some embodiments, a pattern of the orthographic projection of the first planarization layer 5 on the base substrate 1 is complementary to a pattern of the orthographic projection of the first conductive layer 2 on the base substrate 1. That is, the pattern of the orthographic projection of the first planarization layer 5 on the base substrate 1 overlaps with a region outside the orthographic projection of the first conductive layer 2 on the base substrate 1.

Since the first planarization layer 5 is located on a side of the second planarization layer 3 proximal to the first conductive layer 2 and the orthographic projection of the first planarization layer 5 on base substrate 1 is complementary with the orthographic projection of the first conductive layer 2 on base substrate 1, a region of the driving backplane where the first conductive layer 2 is missing can be filled, so as to eliminate the height difference due to the missing of the first conductive layer 2, in turn to avoid the wire breakage of the second conductive layer 4 due to the height difference, and meanwhile to avoid the tilt and the poor welding of the pad due to the height difference.

In some embodiments, a difference between a thickness of the first planarization layer 5 and a thickness of the first conductive layer 2 is less than 1 μm.

In some embodiments, the thickness of the first planarization layer 5 is less than the thickness of the first conductive layer 2. In some embodiments, the first planarization layer 5 has a thickness in a range from 1.8 μm to 7 μm. The first conductive layer 2 has a thickness in a range from 1.8 μm to 7 μm. The second planarization layer 3 has a thickness in a range from 2 μm to 2.5 μm. For example, the first planarization layer has a thickness of 1.9 μm, the first conductive layer 2 has a thickness of 2.7 μm, and the second planarization layer 3 has a thickness of 2 μm. The first planarization layer 5 can substantially eliminate the height difference due to the missing of the first conductive layer 2, and the second planarization layer 3 on first planarization layer 5 can completely eliminate the height difference due to the missing of the first conductive layer 2, thereby avoiding the disconnection of the lines formed by the second conductive layer 4 and the poor welding phenomenon of the pad.

In some embodiments, the first planarization layer 5 has the same thickness as that of the first conductive layer 2. With this configuration, the height difference due to the absence of the first conductive layer 2 can be completely eliminated, and the disconnection of the lines in the second conductive layer 4 can be avoided. Meanwhile, the tilt phenomenon of the pad in the second conductive layer 4 can be completely eliminated, and the poor welding of the pad in the second conductive layer 4 can be avoided.

In some embodiments, an orthographic projection of the second planarization layer 3 on the base substrate 1 covers the base substrate 1. The second planarization layer 3 extends and covers the whole base substrate 1. The second planarization layer 3 is provided with openings only at a position where the second conductive layer 4 is contacted with the first conductive layer 2 and at a position of the bonding terminal in the binding region which is hound and coupled to the peripheral circuit board.

In some embodiments, the first planarization layer 5 is made of a photoresist material, and the photoresist material of the first planarization layer 5 has photosensitivity opposite to that of the photoresist material used for forming the first conductive layer 2. In this case, when the first planarization layer 5 is formed, the first planarization layer 5 can be formed by using the mask plate used in the formation of the first conductive layer 2, therefore one mask plate can be saved. The first conductive layer 2 is formed by a pattern process.

In some embodiments, the first planarization layer 5 is made of a negative photoresist material. A positive photoresist material is coated and exposed during the formation of the first conductive layer. Since the first planarization layer 5 is made of a negative photoresist material, the first planarization layer 5 can be formed without adding one mask plate, and the first planarization layer 5 can be formed directly by using the mask plate used for forming the first conductive layer.

It should be noted that if the first conductive layer 2 is formed by using negative photoresist material during manufacture, the first planarization layer 5 may be made of a positive photoresist material and may also be formed by sharing the same mask plate as the first conductive layer 2.

In some embodiments, the first planarization layer 5 is made of an organic insulation material or an inorganic insulation material. For example, the first planarization layer 5 may be made of materials such as a resin material, silicon nitride, or silicon oxynitride.

Figure 8:
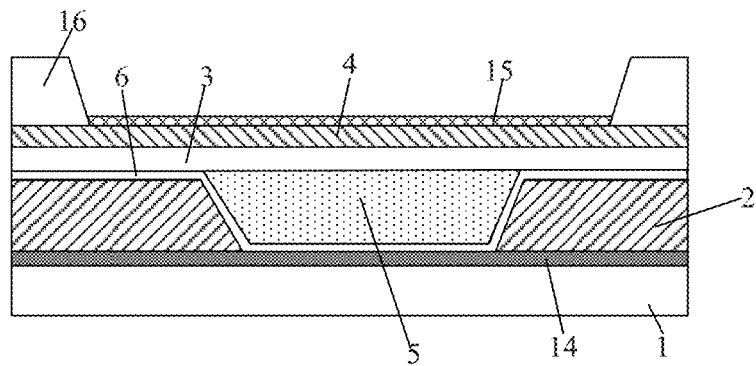
FIG. 8 is a schematic cross-sectional view showing another structure of the driving backplane taken along a section line GG in FIG. 6.

In some embodiments, as shown in FIGS. 6 and 8, the driving backplane further includes a first insulation layer 6 between the first planarization layer 5 and the first conductive layer 2.

In some embodiments, the first insulation layer 6 is made of an inorganic insulation material. The first insulation layer 6 can prevent external moisture and oxygen from entering therein to protect the first conductive layer 2 from being corroded and to ensure good alignment and conductivity. It should be noted that the first insulation layer 6 may also be made of an organic insulation material such as a resin material; and alternatively, the first insulation layer 6 may be a stacked layer of an inorganic insulation material layer and an organic insulation material layer, and prevent the first conductive layer 2 from being corroded by moisture or oxygen.

In some embodiments, as shown in FIG. 6, a plurality of lamp regions 10 are disposed on the driving backplane, two to twelve groups of red-green-blue lamp beads or two to twelve white lamp beads are uniformly distributed in each of the lamp regions 10. The two to twelve groups of lamp beads or the two to twelve lamp beads in each of the lamp regions 10 are coupled in series; and the positive and negative electrodes of the lamp beads coupled in series in each of the lamp regions 10 are electrically coupled to the bonding terminal 11 in the line binding-converging region 8 and the corresponding pins of the driver chip corresponding to each of the lamp regions 10, respectively.

In some embodiments, the driving backplane further includes a buffer layer 14, which is on the base substrate 1 and on a side of the first conductive layer 2 proximal to the base substrate 1. The buffer layer 14 protects the base substrate 1 from being broken under stress caused by the first conductive layer 2 to be formed subsequently. The buffer layer 14 is made of silicon nitride.

In some embodiments, both of the first conductive layer 2 and the second conductive layer 4 are made of copper. The second planarization layer 3 may include two layers. One of the two layers is an inorganic insulation material layer such as a silicon nitride or silicon oxynitride layer, and the other of the two layers is an organic insulation material layer such as a transparent resin layer or a photoresist layer. The second planarization layer 3 has the function of blocking water vapor and oxygen, and can further improve the sealing property of the driving backplane. Of course, the second planarization layer 3 may also be made of an inorganic insulation material layer alone or made of an organic insulation material layer alone. Since an orthographic projection of the second planarization layer 3 on the base substrate 1 covers the entire base substrate 1, the second planarization layer 3 cannot eliminate the height difference caused by the absence of the first conductive layer 2.

In some embodiments, a protective layer 15 and a third planarization layer 16 are also formed on a side of the second conductive layer 4 distal to the base substrate 1. The protective layer 15 and the third planarization layer 16 are stacked sequentially on the second conductive layer 4. An orthographic projection of the protective layer 15 on the base substrate 1 covers the exposed second conductive layer 4. For example, the protective layer 15 covers the bonding terminal 11 in the line binding-converging region 8. The protective layer 15 can protect the second conductive layer 4 from being oxidized and corroded during the high-temperature welding process. The protective layer 15 is made of CuNi or ITO.

In some embodiments, the third planarization layer 16 includes two layers. One of the two layers is an inorganic insulation material layer, such as a silicon nitride or silicon oxynitride layer, and the other of the two layers is an organic insulation material layer, such as a transparent resin layer or a photoresist material layer. The third planarization layer 16 has the function of blocking water vapor and oxygen, and can further improve the sealing performance of the driving backplane.

Figure 9:
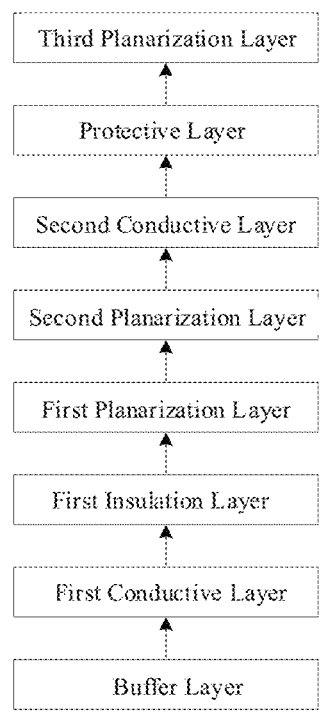
FIG. 9 is a schematic flow chart showing a process for manufacturing a driving backplane according to an embodiment of the present disclosure.

Based on the above structure of the driving backplane, an embodiment of the present disclosure further provides a method for manufacturing the driving backplane. As shown in FIG. 9, the method includes: forming a pattern of a first conductive layer on a base substrate; forming a first planarization layer pattern in a region outside/except the pattern of the first conductive layer; forming a pattern of a second planarization layer on the first conductive layer and the first planarization layer; and forming a pattern of a second conductive layer on the second planarization layer. An orthographic projection of the first conductive layer on the base substrate partially overlaps with an orthographic projection of the second conductive layer on the base substrate.

In some embodiments, the first planarization layer and the first conductive layer are formed by using the same mask, and the first planarization layer and the first conductive layer are formed by using photoresist materials with different properties.

In some embodiments, the formation of the first conductive layer includes steps S101 to S103.

At step S101, a first metal film layer is deposited.

In this step, the first metal film, such as a copper layer, is deposited on the base substrate through an ion sputtering process.

At step S102, a positive photoresist film is coated, and exposure and development processes are performed on the positive photoresist film by using a mask plate to remove a portion of the positive photoresist film which is not shielded by the mask plate and to remain a portion of the positive photoresist film which is shielded by the mask plate.

At step S103, the first metal film layer which is not covered by the positive photoresist film is etched and removed to form a pattern of the first conductive layer. The pattern of the first conductive layer corresponds to a pattern of a mask plate.

In some embodiments, the first conductive layer includes a plurality of sub-layers, therefore the steps S101 to S103 need to be repeated several times during the manufacture process of the first conductive layer to finally form the pattern of the first conductive layer with a thickness meeting the requirement.

In some embodiments, the formation of the first planarization layer includes step S201 and S202.

At step S201, a negative photoresist film is coated on the base substrate on which the first conductive layer is formed.

At step S202, exposure and development processes are performed on the negative photoresist film by using a mask plate used for forming the first conductive layer, to remove a portion of the negative photoresist film shielded by the mask plate and to remain a portion of the negative photoresist film not shielded by the mask plate, so as to form a pattern of the first planarization layer. The pattern of the first planarization layer is the pattern of the reserved portion of the negative photoresist film which is not shielded by the mask plate.

In some embodiments, a negative photoresist may also be employed in the exposure process for forming the pattern of the first conductive layer, and correspondingly, a positive photoresist may be employed in the exposure process for forming the pattern of the first planarization layer.

In the embodiment of the present disclosure, a mask plate for forming the first conductive layer is adopted in the formation of the first planarization layer, so that one mask plate can be saved and the manufacture cost is lowered.

In some embodiments, the manufacture method further includes a step of forming a buffer layer before the formation of the first conductive layer. The buffer layer can protect the base substrate from being broken under the stress generated by the first conductive layer to be formed subsequently.

In some embodiments, the first planarization layer is formed prior to the formation of the second planarization layer. The formation of the second planarization layer specifically includes: forming a piece of inorganic insulation film layer covering the whole base substrate through a chemical vapor deposition, wherein the inorganic insulation film layer is made of silicon nitride or silicon oxynitride material; forming a pattern of the inorganic insulation layer and an opening therein through a dry etching process; coating and forming an organic insulation layer film layer on the base substrate; and forming a pattern of the organic insulation layer and an opening therein through the exposure and development processes. The second planarization layer may be formed through an exposure process (including exposure, development and etching processes) once.

In some embodiments, the method further includes forming a pattern of the first insulation layer after the formation of the first conductive layer and before the formation of the first planarization layer. The formation of the first insulation layer specifically includes: forming a piece of inorganic insulation film layer covering the whole base substrate through a chemical vapor deposition, wherein the inorganic insulation film layer is made of silicon nitride or silicon oxynitride material; forming a pattern of the inorganic insulation layer through a dry etching process; and forming an opening at a position of the first insulation layer at which the first conductive layer is in contact with and coupled to the second conductive layer, so that the first conductive layer and the second conductive layer are coupled together via the opening. In addition, if the first insulation layer further includes an organic insulation material layer, it is necessary to further coat an organic insulation film layer on the base substrate; and form a pattern of the organic insulation layer and an opening therein through the exposure and development processes. The first insulation layer can be formed through an exposure process (including exposure, development and etching processes) once.

In some embodiments, the method further includes a step of forming a protective layer after the formation of the second conductive layer. The specific step of forming the protective layer includes: depositing, through an ion sputtering process, a conductive metal film layer, such as a CuNi or ITO layer, on the base substrate on which the second conductive layer is formed; and forming a pattern of the protective layer through a pattern process (including photoresist coating, exposure, development, etching processes, etc.).

In some embodiments, the method for manufacturing the driving backplane further includes a step of forming a third planarization layer after the formation of the protective layer. The specific step for forming the third planarization layer includes: forming, through a chemical vapor deposition process, a piece of an inorganic insulation film layer covering the whole base substrate on which the protective layer is formed, wherein the inorganic insulation film layer is made of silicon nitride or silicon oxynitride material; forming a pattern of the inorganic insulation layer and an opening therein through a dry etching process; coating an organic insulation layer film layer on the base substrate; and forming a pattern of the organic insulation layer and an opening therein through exposure and development processes.

The manufacturing process of the driving backplane in the embodiment is not limited to the above-mentioned process, and other well-established processes may also be adopted.

According to the driving backplane provided by the embodiments of the present disclosure, since the first planarization layer is located on a side of the second planarization layer proximal to the first conductive layer and a pattern of an orthographic projection of the first planarization layer on the base substrate is complementary with a pattern of an orthographic projection of the first conductive layer on the base substrate, a region of the driving backplane where the first conductive layer is absent is filled, and the height difference due to the absence of the first conductive layer is eliminated, thereby avoiding the wire breakage of the second conductive layer 4 due to the height difference, and meanwhile avoiding the tilt phenomenon and the poor welding of the pad due to the height difference.

Figure 10:
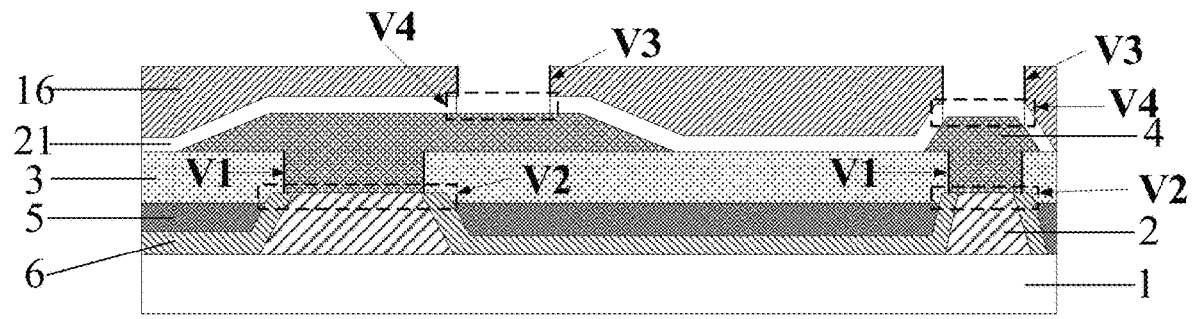
FIG. 10 is a schematic cross-sectional view showing a structure of the driving backplane taken along section line HH in FIG. 11.
Figure 11:
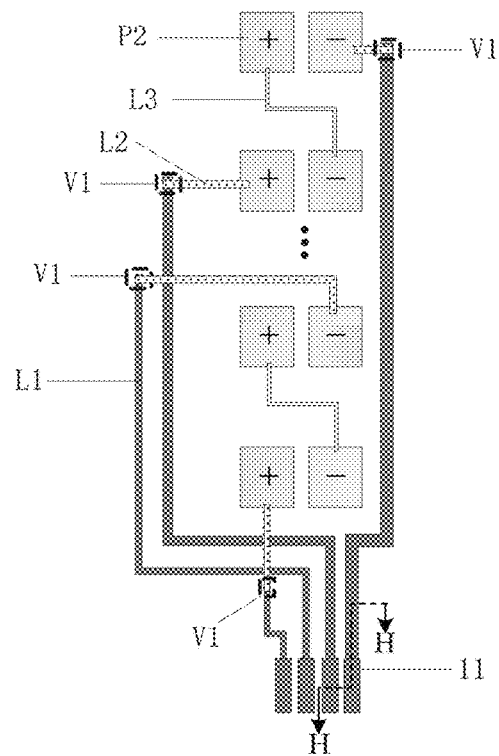
FIG. 11 is a schematic plan view showing another structure of a driving backplane according to an embodiment of the present disclosure.

An embodiment of the present disclosure further provides a driving backplane. On the basis of the driving backplane in the above embodiment, as shown in FIGS. 10 and 11, in the embodiment, no buffer layer is disposed in the driving backplane. The second planarization layer 3 includes a plurality of first via holes V1. The pattern of the second conductive layer 4 is electrically coupled to the pattern of the first conductive layer 2 through the first via hole V1. Since the first planarization layer 5 is provided in a region outside the pattern of the first conductive layer 2 on the base substrate 1, the first planarization layer 5 having a good thickness uniformity can be formed during the manufacturing process, and the height difference between a thickness of the first conductive layer 2 and a thickness of the first planarization layer 5 is small, so that the second planarization layer 3 having a good thickness uniformity can be formed, and in turn the planarization layers (i.e., the first planarization layer 5 and the second planarization layer 3) between the first conductive layer 2 and the second conductive layer 4 have a good thickness uniformity. Due to the good thickness uniformity of the second planarization layer 3, the difference between the actual size and the design value of the first via hole V1 in the second planarization layer 3 is small, thereby ensuring coupling effect between the first conductive layer 2 and the second conductive layer 4. In addition, the pattern of the first planarization layer 5 is complementary to the pattern of the first conductive layer 2, so that during the manufacture process, a patter process can be performed on the first planarization layer 5 by using the same mask plate as the mask plate used for patterning the first conductive layer 2. Compared with the related art in which the pattern process is performed on the planarization layer twice, the present disclosure can save one mask plate and lower the manufacture cost.

In some embodiments, as shown in FIG. 10, the thickness of the first planarization layer 5 is less than or equal to the thickness of the first conductive layer 2. Thus, it is possible to avoid a poor uniformity in the thickness of the first planarization layer 5 formed during the manufacture process due to a large thickness of the first planarization layer 5. In an implementation, the thickness of the first planarization layer 5 may be greater than half of the thickness of the first conductive layer 2, for example, the thickness of the first conductive layer 2 is about 7 µm, and the thickness of the first planarization layer 5 is about 5 µm, so that it is possible to avoid a poor uniformity of the thickness of the resulted second planarization layer 3 due to the small thickness of the first planarization layer 5 during the manufacturing process.

In some embodiments, as shown in FIG. 11, the first conductive layer may include a plurality of bonding terminals 11 and a plurality of first connection lines L1. The second conductive layer may include a plurality of connection electrodes P2 and a plurality of second connection lines L2. The bonding terminal 11 may be electrically coupled to the driver chip. For example, the bonding terminal 11 may be directly electrically coupled to the driver chip. Or alternatively, the driver chip may be fixed on the flexible circuit board, and the bonding terminal 11 is electrically coupled to the driver chip through a flexible circuit board. The connection electrode P2 may be electrically connected to the light emitting diode, and the connection electrode P2 includes a first connection electrode and a second connection electrode. The first connection electrode (i.e., a connection electrode P2 marked with "+" in the drawings) is electrically coupled to an anode of the light emitting diode, and the second connection electrode (i.e., a connection electrode P2 marked with "+" in the drawings) is electrically coupled to a cathode of the light emitting diode. One end of the first connection line L1 is electrically coupled to the bonding terminal 11, the other end of the first connection line L1 is electrically coupled to the second connection line L2 through the first via hole V1, and the second connection line L2 is electrically coupled to the connecting electrode P2, so that the electrical connection between the bonding terminal 11 and the connecting electrode P2 is realized, and thus the driver chip may control the light emitting diode to emit light. In addition, the second conductive layer may further include a plurality of third connection lines L3. A third connection line L3 connects the first connection electrode to the second connection electrode, thereby achieving a series connection of the light emitting diodes.

It should be noted that, in the embodiment of the present disclosure, the structure shown in FIG. 11 is taken as an example to illustrate the structures of the first conductive layer and the second conductive layer. In an implementation, the first conductive layer and the second conductive layer may also include other structures, which is not limited herein. In FIG. 11, in order to show the connection relationship between the first conductive layer and the second conductive layer, a pattern of the first conductive layer and a pattern of the second conductive layer are shown in the same plan view. However, actually the first conductive layer and the second conductive layer are stacked, and the first conductive layer is electrically coupled to the second conductive layer through the first via hole in the second planarization layer.

In an embodiment, in order to improve the performance of the driving backplane and decrease the driving resistance of the driving backplane, the thickness of the first conductive layer is greater than 7 µm so as to decrease the sheet resistance of the first conductive laver. Moreover, the first conductive layer may be made of a material with a good conductivity. For example, the first conductive layer may be made of a metal material (e.g., metal copper) or other materials with a good conductivity, which is not limited herein. Since the connection line in the second conductive layer has a short length, the thickness of the second conductive layer may be smaller than the thickness of the first conductive layer. For example, the thickness of the second conductive layer is about several thousand angstroms. The second conductive layer may also be made of a metal material (e.g., metal copper) or other materials with good conductivity, which is not limited herein.

In some embodiments, the first and second planarization layers may be made of a photosensitive resin material, for example, polyimide resin, vinyl silane, or the like. The exposure and development processes may be performed on the first and second planarization layers during the manufacture process to form the patterns of the first and second planarization layers, such a manufacture process is simple. In addition, the first and second planarization layers may be made of other insulation materials, which is not limited herein. The materials of the first and second planarization layers may be the same or different, and are not limited herein.

In an embodiment, the material for forming the first planarization layer is generally a mixture including a solvent, a reactive monomer, an additive, and the like. The curing temperature for the first planarization layer during the curing process is different due to different ratios of components in the mixture. The material for forming the first planarization layer includes a high-temperature curing material and a low-temperature curing material. When the first planarization layer is made of the high-temperature curing material, the curing temperature during the curing process is about 230°. The first conductive layer is easily oxidized at high temperature during the manufacture process of the first planarization layer, resulting in defects such as bubbles in the film layer.

In some embodiments, as shown in FIG. 10, the driving backplane may further include: a third planarization layer 16 located on a side of the second conductive layer 4 distal to the base substrate 1; and a second insulation layer 21 located between the second conductive layer 4 and the third planarization layer 16. The first insulation layer 6 includes a plurality of second via holes V2 corresponding to the first via holes V1, respectively. The third planarization layer 16 includes a plurality of third via holes V3, The second insulation layer 21 includes a plurality of fourth via holes V4 corresponding to the third via holes V3, respectively.

The first insulation layer 6 is between the first conductive layer 2 and the first planarization layer 5. The first insulating layer 6 has the function of blocking water vapor and oxygen, thereby improving the sealing performance of the driving backplane, and preventing the water vapor and the oxygen from eroding the driving backplane. If the first planarization layer 5 is made of the high-temperature curing material, the first insulation layer 6 can prevent the first conductive layer 2 from being oxidized at the high temperature during the manufacture process of the first planarization layer 5.

Similarly, the second insulation layer 21 is between the second conductive layer 4 and the third planarization layer 16. The second insulation layer 21 also has the function of blocking water vapor and oxygen, thereby further improving sealing performance of the driving backplane. If the third planarization layer 16 is made of the high-temperature curing material, the second insulation layer 21 can prevent the second conductive layer 4 from being oxidized at a high temperature during the manufacture process of the third planarization layer 16. Specifically, the first insulation layer 6 and the second insulation layer 21 may be made of the inorganic materials such as SiN or SiNO or other inorganic materials, which are not limited herein.

With continued reference to FIG. 10, a third planarization layer 16 is formed on a side of the second conductive layer 4 distal to the base substrate 1, and the third planarization layer 16 can protect and planarize the drive backplane. A second via hole V2 corresponding to the first via hole V1 is formed in the first insulation layer 6, so that the first conductive layer 2 can be electrically coupled to the second conductive layer 4 through the first via hole V1 and the second via hole V2. Referring to FIG. 11, the third via hole V3 and the fourth via hole V4 may be located at a position where the bonding terminal 11 is located to expose the bonding terminal 11, so that the bonding terminal 11 is electrically coupled to the driver chip in the subsequent process.

In addition, if the first planarization layer and the third planarization layer are made of the low-temperature curing material, the curing temperature during the curing process is about 130°, and the first conductive layer and the second conductive layer are not easily oxidized, and thus the first insulation layer and the second insulation layer can be omitted. Of course, in order to prevent the first conductive layer and the second conductive layer from being oxidized and improve the sealing performance of the driving backplane, the first insulation layer and the second insulation layer may be formed if the first planarization layer and the third planarization layer are made of the low-temperature curing material, which is not limited herein.

In practical applications, the larger the thickness of the first conductive layer is, the larger the thickness of the first insulation layer is, so as to ensure that the first insulation layer can completely cover the slope at the edge of the pattern of the first conductive layer. For example, when the thickness of the first conductive layer is about 7 μm, the thickness of the first insulation layer is about 5000 angstroms. However, during the manufacture process, the first insulation layer is etched by using the pattern of the second planarization layer as a mask, and the etching speed at which the second planarization layer is etched is higher than the etching speed at which the first insulation layer is etched. Therefore, the thickness of the first insulation layer cannot be too large, otherwise the pattern of the second planarization layer will be damaged during the etching process. Therefore, if the thickness of the first conductive layer is larger, the first planarization layer may be made of the low-temperature curing material in order to avoid the pattern of the second planarization layer from being damaged, and the first insulation layer can be omitted.

Figure 12:
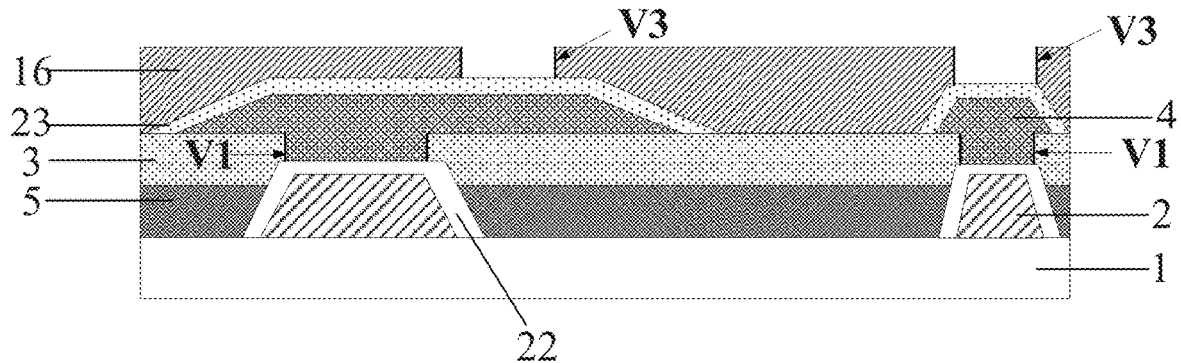
FIG. 12 is a schematic cross-sectional view showing another structure of the driving backplane taken along a section line HH in FIG. 11.

In some embodiments, as shown in FIG. 12, the driving backplane may further include: a first protective layer 22 located between the first conductive layer 2 and the second conductive layer 4. and a second protective layer 23 located on a side of the second conductive layer 4 distal to the base substrate 1. A pattern of the first protective layer 22 coincides with a pattern of the first conductive layer 2, and a pattern of the second protective layer 23 coincides with a pattern of the second conductive layer 4.

Since the first protective layer 22 is between the first conductive layer 2 and the second conductive layer 4 and the pattern of the first protective layer 22 is consistent with the pattern of the first conductive layer 2, the first protective layer 22 can protect the first conductive layer 2 from being oxidized. In order to further improve the protection effect of the first protective layer 22, the pattern of the first protective layer 22 may be a pattern covering the first conductive layer 2. Similarly, since the second protective layer 23 is disposed on a side of the second conductive layer 4 distal to the base substrate 1 and the pattern of the second protective layer 23 coincides with the pattern of the second conductive layer 4, the second protective layer 23 can protect the second conductive layer 4 from being oxidized. In order to further improve the protection effect of the second protective layer 23, the pattern of the second protective layer 23 may be a pattern covering the second conductive layer 4. Specifically, the first protective layer 22 and the second protective layer 23 may be made of a metal material (e.g., gold), a metal alloy (e.g., CuNi), or other materials not easily oxidized, which is not limited herein.

Figure 13:
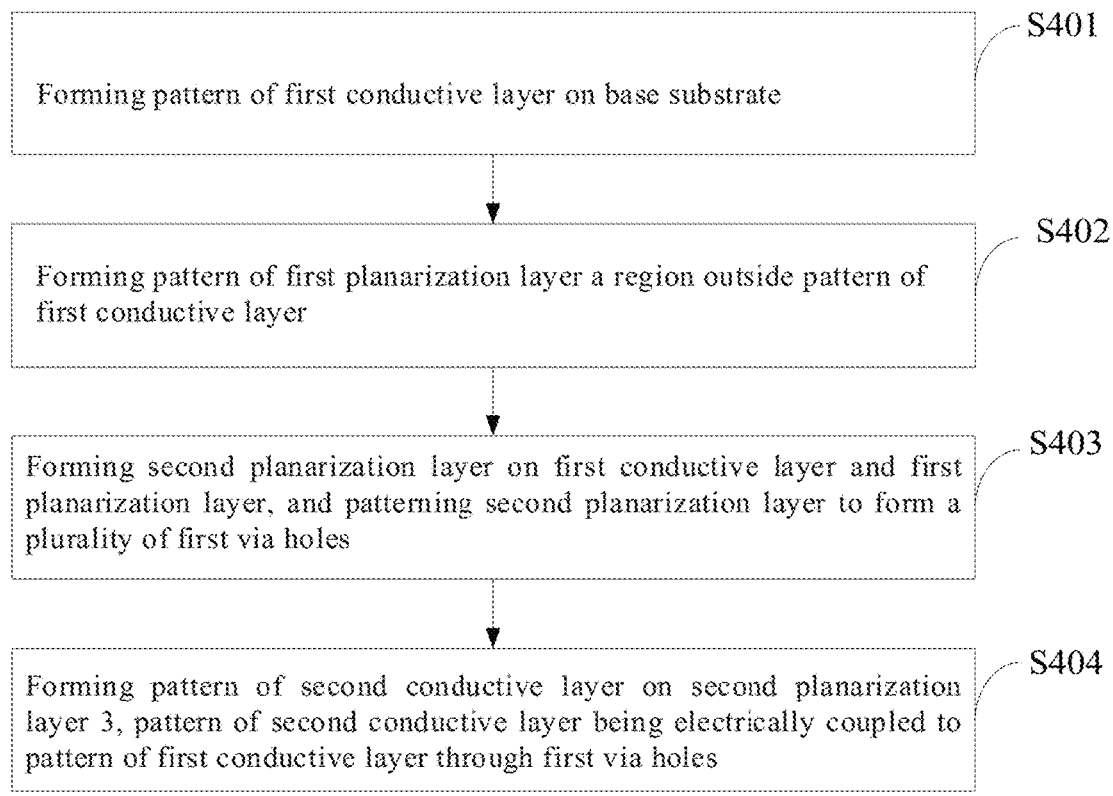
FIG. 13 is a flowchart showing a method for manufacturing a driving backplane according to another embodiment of the present disclosure.

Based on the above structure of the driving backplane, an embodiment of the present disclosure further provides a method for manufacturing the driving backplane, as shown in FIG. 13, the method includes step S401 to S404.

Figure 14A:
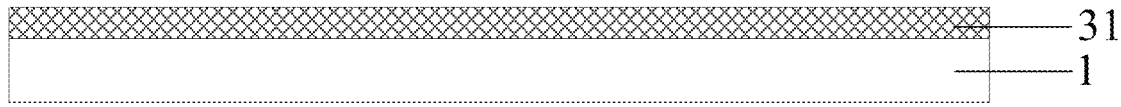
FIGS. 14a to 14l, and FIGS. 15a and 15b are schematic diagrams showing structures corresponding to steps in a manufacturing method according to another embodiment of the present disclosure.
Figure 14B:
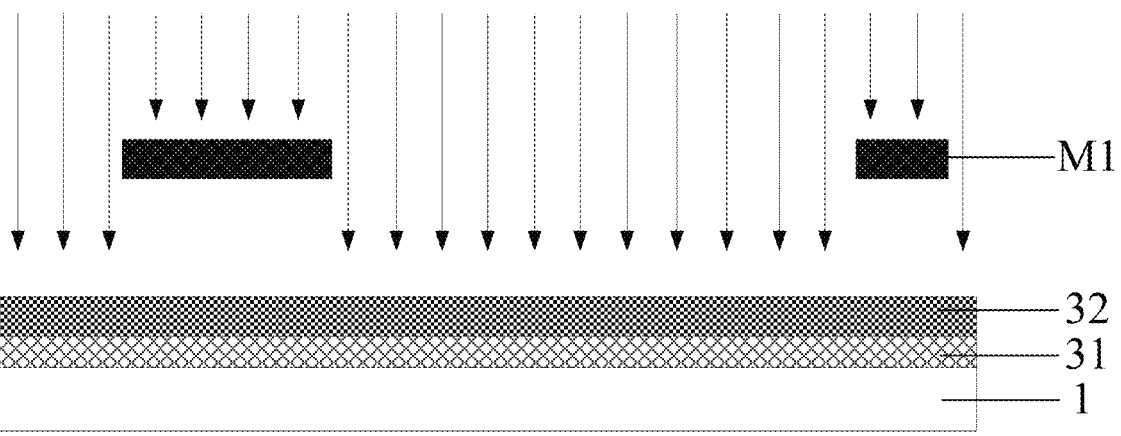
Figure 14C:
Figure 14D:

At step S401, referring to FIG. 14d, a pattern of the first conductive layer 2 is formed on the base substrate 1.

Figure 14E:
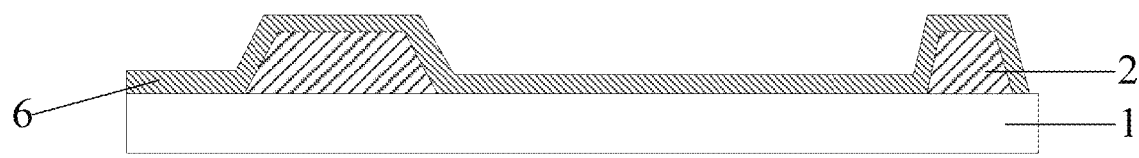
Figure 14F:
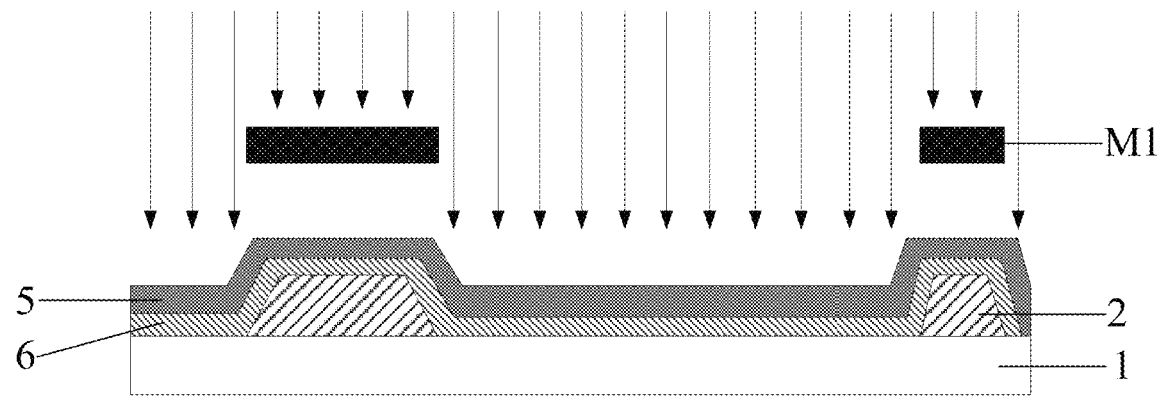
Figure 14G:

At step S402, referring to FIG. 14g, a pattern of the first planarization layer 5 is formed in a region outside the pattern of the first conductive layer 2.

Figure 14H:
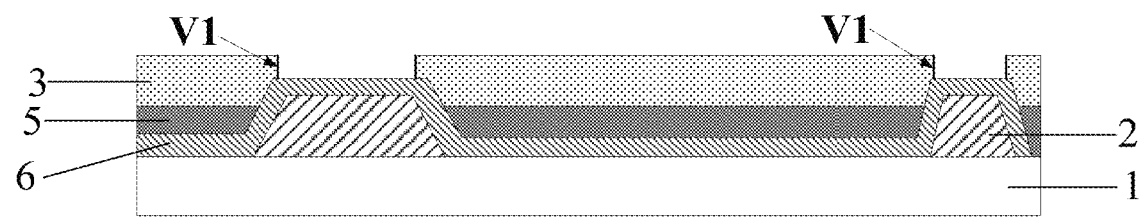

At step S403, referring to FIG. 14h, a second planarization layer 3 is formed on the first conductive layer 2 and the first planarization layer 5. and a pattern process is performed on the second planarization layer 3 to form a plurality of first via holes V1.

Figure 14I:
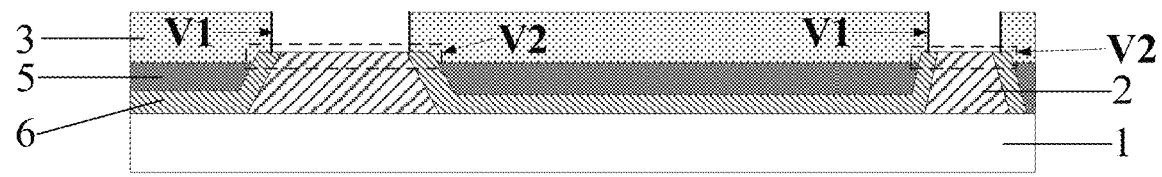
Figure 14J:
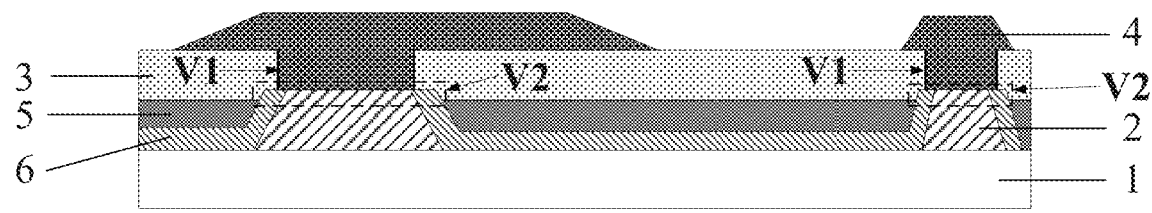

At step S404, referring to FIG. 14j, a pattern of the second conductive layer 4 is formed on the second planarization layer 3, and the pattern of the second conductive layer 4 is electrically coupled to the pattern of the first conductive layer 2 through the first via hole V1.

In the manufacturing method provided by the embodiment of the present disclosure, the pattern of the first planarization layer is formed in the region outside the pattern of the first conductive layer, so that the resulted first planarization layer has a good thickness uniformity. The height difference between the first conductive layer and the first planarization layer is small, so that the resulted second planarization layer has a good thickness uniformity. Therefore, the planarization layers (i.e., the first planarization layer and the second planarization layer) between the first conductive layer and the second conductive layer have a good thickness uniformity. Since the second planarization layer has a good thickness uniformity, the difference between the actual size and the design value of the formed first via hole is smaller, thereby ensuring the coupling effect between the first conductive layer and the second conductive layer. In addition, since the pattern of the first planarization layer is complementary to the pattern of the first conductive layer, the first planarization layer can be patterned by using the same mask plate as the mask plated used for patterning the first conductive layer. Compared with the related art in which the planarization layer are patterned through a patterning process for two times, one mask plate can be omitted and the manufacture cost can be lowered.

In an embodiment of the present disclosure, the pattern of the first conductive layer and the pattern of the first planarization layer may be formed in at least two ways as follows, which will be described in detail below with reference to the accompanying drawings.

Method I

The step S401 may include: forming a plating seed layer 31 on a base substrate 1, as shown in FIG. 14a. The plating seed layer 31 has a small thickness and serves as an electrode during a plating process. For example, the plating seed layer 31 may have a thickness of about 3000 angstroms, and the material, e.g., copper, of the plating seed layer 31 may be the same as the material of the first conductive layer 2.

As shown in FIG. 14b, a photoresist layer 32 is formed on the plating seed layer 31, and a pattern process is performed on the photoresist layer 32 to form a pattern of the photoresist layer 32 complementary to the pattern of the first conductive layer to be formed, as shown in FIG. 14c. Specifically, the exposure process may be performed on the photoresist layer 32 by shielding the photoresist layer 32 with a mask plate M1. The arrow indicates the light used during the exposure process, as shown in FIG. 14b. The development process is performed on the photoresist layer 32 to obtain the pattern of the photoresist layer 32 shown in FIG. 14c. It should be noted that, the photoresist layer 32 may be formed by employing a negative photoresist in Method I, and in an implementation, the photoresist layer 32 may also be formed by employing a positive photoresist, which is not limited herein.

Referring to FIG. 14c, a pattern of the first conductive layer 2 shown in FIG. 14d is formed through an electroplating process by using the pattern of the photoresist layer 32 as a mask. Specifically, the driving backplane shown in FIG. 14c is placed in a plating solution to form the pattern of the first conductive layer 2 in the regions not covered by the photoresist layer 32; the photoresist layer 32 is stripped; and the excess plating seed layer (i.e., portions of the plating seed layer covered by the photoresist layer during the electroplating process) is removed through an etching process to obtain the structure shown in FIG. 14d.

In some embodiments, the first planarization layer 5 is made of a photoresist material, and the photoresist material of the first planarization layer 5 has the same photosensitivity as the photosensitivity of the photoresist material used for forming the first conductive layer 2. With such an arrangement, when the first planarization layer 5 is formed, the first planarization layer 5 may be formed by using the same mask plate as the mask plate used for forming the first conductive layer 2, thereby saving one mask plate.

The step S402 may include: as shown in FIG. 14f, forming a first planarization layer 5 on the first conductive layer 2 with a photoresist material having the same photosensitivity as the photosensitivity of the photoresist layer.

Also referring to FIG. 14f, the pattern process is performed on the first planarization layer 5 by using the same mask plate as the mask plate used for patterning the photoresist layer. That is, the exposure process is performed on the first planarization layer 5 by shielding the first planarization layer 5 with the mask plate M1. As shown in FIG. 14f, the arrow indicates the light used during the exposure process. The development process is performed on the first planarization layer 5 to form the pattern of the first planarization layer 5 in FIG. 14f. It should be noted that the first planarization layer 5 made of a negative photoresist is illustrated as an example in Method I. In an implementation, the first planarization layer 5 may also be made of a positive photoresist, as long as the photosensitivity of the first planarization layer 5 is the same as the photosensitivity of the photoresist layer, which is not limited herein.

Method II

The step S401 may include: as shown in FIG. 14a, forming a plating seed layer 31 on the base substrate 1. The plating seed layer 31 has a small thickness and serves as an electrode during an electroplating process. For example, the plating seed layer 31 may have a thickness of about 3000 angstroms, and the material, e.g., copper, of the plating seed layer 31 may be the same as the material of the first conductive layer 2.

Figure 15A:
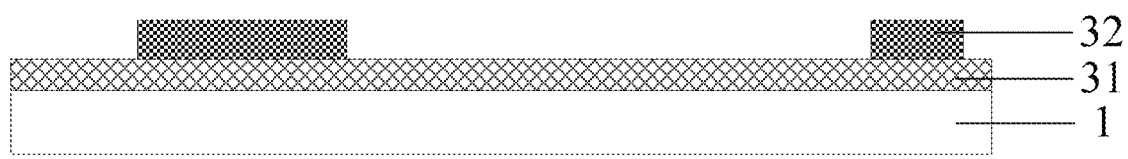
Figure 15B:
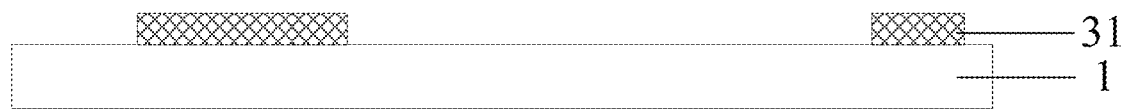

As shown in FIG. 14b, a photoresist layer 32 is formed on the plating seed layer 31. The pattern process is performed on the photoresist layer 32 to obtain a pattern of photoresist layer 32 which is consistent with the pattern of the first conductive layer to be formed, as shown in FIG. 15a. Specifically, the exposure process is performed on the photoresist layer 32 by shielding the photoresist layer 32 with the mask plate M1. As shown in FIG. 14b, the arrow indicates the light used during the exposure process. The development process is performed on the photoresist layer 32 to form the pattern of the photoresist layer 32 shown in FIG. 15a. It should be noted that, the photoresist layer 32 made of a positive photoresist is illustrated as an example in Method II. In an implementation, the photoresist layer 32 may also be made of a negative photoresist, which is not limited herein. The pattern process is performed on the plating seed layer 31 to obtain a pattern of the plating seed layer 31 as shown in FIG. 15b.

The first conductive layer 2 is formed on the base substrate 1 through an electroplating process to obtain a structure as shown in FIG. 14d. In Method II, the pattern process is performed on the plating seed layer 31, so that the pattern of the plating seed layer 31 is consistent with the pattern of the first conductive layer 2 to be formed: and during the electroplating process, the driving backplane shown in FIG. 15b is placed in the plating solution, and the pattern of the first conductive layer 2 is formed at the pattern of the plating seed layer 31, so as to obtain the structure shown in FIG. 14d.

In some embodiments, the first planarization layer 5 is made of a photoresist material, and the photoresist material used for forming the first planarization layer 5 has photosensitivity opposite to the photosensitivity of the photoresist material used for forming the first conductive layer 2. With such an arrangement, when the first planarization layer 5 is formed, the first planarization layer 5 may be formed by using the mask plate used for forming the first conductive layer 2, so that one mask plate can be omitted.

The step S402 may include: as shown in FIG. 14f, forming a first planarization layer 5 on the first conductive layer 2 by using a photoresist material having a photosensitivity opposite to the photosensitivity of a first photoresist material.

Referring also to FIG. 14f, a pattern process is performed on the first planarization layer 5 by using the same mask plate as the mask plate used for patterning the photoresist layer. That is, the exposure process is performed on the first planarization layer 5 by shielding the first planarization layer 5 with the mask plate M1. As shown in FIG. 14f, the arrow indicates the light used during the exposure process. The development process is performed on the first planarization layer 5 to obtain the pattern of the first planarization layer 5 shown in FIG. 14g. It should be noted that, in Method II, the first planarization layer 5 made of a negative photoresist is illustrated as an example. In an implementation, the first planarization layer 5 may also be made of a positive photoresist, as long as the photosensitivity of the first planarization layer 5 is opposite to the photosensitivity of the photoresist layer, which is not limited herein.

It should be noted that, in the embodiment of the present disclosure, an embodiment in which the step S401 is performed first and then the step S402 is performed, is taken as an example, that is, the pattern of the first conductive layer is formed first, and then the pattern of the first planarization layer is formed. In an implementation, the step S402 may be performed first, and then the step S401 is performed, that is, the pattern of the first planarization layer is formed first, and then the pattern of the first conductive layer is formed, which is not limited herein.

Optionally, in the manufacture method provided in the embodiment of the present disclosure, after the step S401 and before the step S402, the method may further include: as shown in FIG. 14e, forming a first insulation layer 6 on the first conductive layer 2.

After the step S403 and before the step S404, the method may further include: performing a pattern process on the first insulation layer 6 by using the pattern of the second planarization layer 3 as a mask to obtain a plurality of second via holes V2 corresponding to the first via holes V1, respectively, as shown in FIGS. 14h and 14i.

The first insulation layer 6 is formed on the first conductive layer 2, the driving backplane can be prevented from being corroded by moisture and oxygen, and the first conductive layer 2 can be prevented from being oxidized. Since the first insulation layer 6 and the second planarization layer 3 have the same pattern, the pattern of the second planarization layer 3 can be used as a mask during the pattern process of the first insulation layer 6, without forming a photoresist layer on the first insulation layer 6 for shielding, so that the manufacture cost is lowered.

Figure 14K:
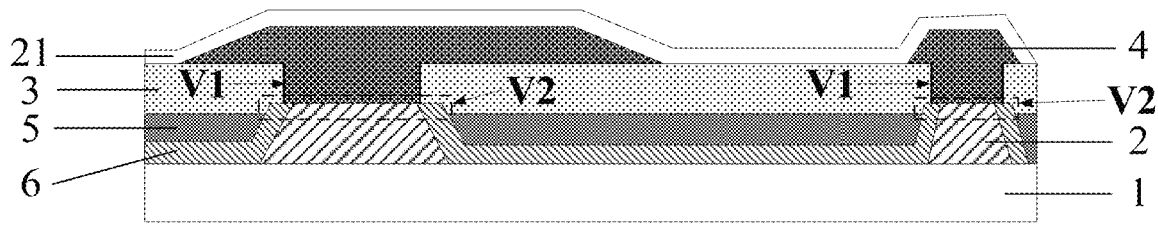

In an implementation, in the manufacture method provided in the embodiment of the present disclosure, after the step S404, the method may further include: as shown in FIG. 14k, forming a second insulation layer 21 on the second conductive layer 4.

Figure 14L:
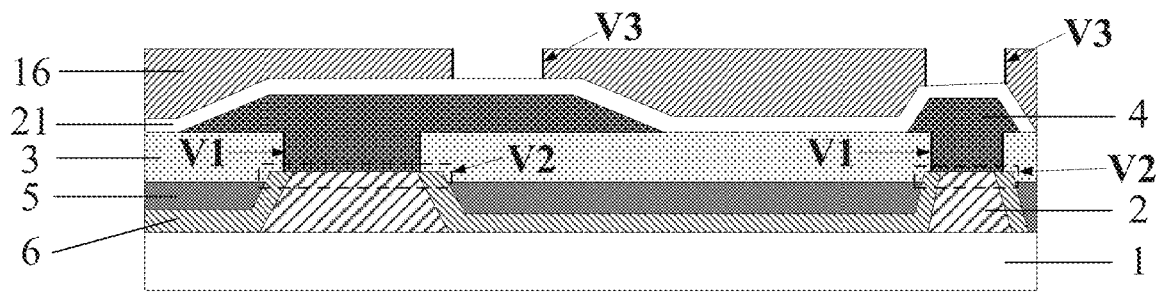

As shown in FIG. 14l, a third planarization layer 16 is formed on the second insulation layer 21, and a pattern process is performed on the third planarization layer 16 to obtain a plurality of third via holes V3.

The pattern process is performed on the second insulation layer 21 by using the third planarization layer 16 as a mask, so as to obtain a plurality of fourth via holes V4 corresponding to the third via holes V3, respectively.

The second insulation layer 21 is formed on the second conductive layer 4, the driving backplane can be prevented from being corroded by moisture and oxygen, and the second conductive layer 4 can be prevented from being oxidized. Since the third planarization layer 16 is formed on the second insulation layer 21, the driving backplane can be protected and planarized. Since the second insulation layer 21 and the third planarization layer 16 have the same pattern, during the pattern process of the second insulation layer 21, the pattern of the third planarization layer 16 can be used as a mask without forming a photoresist layer on the second insulation layer 21 for shielding, thereby lowering the manufacture cost. Specifically, the first insulation layer 6 and the second insulation layer 21 may be made of inorganic materials such as SiN or SiNO or other inorganic materials, which are not limited herein.

In some embodiments, in the manufacture method provided in the embodiment of the present disclosure, after the step S401 and before the step S402, the method may further include: forming a pattern of the first protective layer 22 on the first conductive layer 2, referring to FIG. 12. Since the pattern of the first protective layer 22 coincides with the pattern of the first conductive layer 2, the first protective layer 22 can protect the first conductive layer 2 and prevent the first conductive layer 2 from being oxidized. In the actual process, the pattern process is performed on the first protective layer 22 by using the same mask plate as the mask plate used for patterning the first conductive layer 2, so that one mask plate can be saved, and the manufacture cost can be lowered. Moreover, the pattern of the first protection layer 22 may be formed to cover the pattern of the first conductive layer 2 by adjusting the process parameters, such as the exposure time, during the pattern process.

After the step S403, the method may further include: forming a second protective layer 23 on the second conductive layer 4, referring to FIG. 12. Since the pattern of the second protective layer 23 coincides with the pattern of the second conductive layer 4, the second protective layer 23 can protect the second conductive layer 4 and protect the second conductive layer 4 from being oxidized. In the actual process, a mask plate which is the same as the mask plate used for patterning the second conductive layer 4 may be adopted to pattern the second protecting layer 23, so that one mask plate can be saved, and the manufacture cost can be lowered. Moreover, the pattern of the second protective layer 23 may be formed to cover the pattern of the second conductive layer 4 by adjusting the process parameters such as the exposure time, during the pattern process.

Specifically, the first protective layer 22 and the second protective layer 23 may be made of a metal material (e.g., gold) that is not easily oxidized; or alternatively the first protective layer 22 and the second protective layer 23 may be made of a metal alloy (e.g., CuNi) or other materials, which is not limited herein.

In the embodiment of the present disclosure, since the pattern of the first planarization layer is complementary to the pattern of the first conductive layer, the first planarization layer may be patterned by using the same mask as the mask plate used for patterning of the first conductive layer. However, the alignment mark on the driving backplane cannot be reused, which results in the alignment failure during the pattern process of the first planarization layer. Specifically, the exposure process is performed, by an exposure machine, on the photoresist layer by shielding the photoresist layer by a mask plate during the pattern process of the first conductive layer. The exposure machine captures the alignment marks on the driving backplane and aligns the alignment marks with the corresponding alignment marks on the mask plate. Each of the alignment marks on the driving backplane and the alignment marks on the mask plate have a certain pattern. For example, the alignment mark on the driving backplane has a shape of "#", and the alignment mark on the mask plate has a shape of diamond. However, during the process of patterning the first conductive layer, a pattern consistent with the alignment marks in the mask plate may be formed on the alignment marks on the driving backplane. For example, a diamond pattern is formed on the surface of the alignment mark with the "#" shape on the driving backplane. That is to say, the alignment marks on the driving backplane are shielded. During the pattern process for the first planarization layer, since the alignment marks on the driving backplane are shielded by other patterns, the exposure machine cannot capture the alignment marks on the driving backplane, which results in an error report of the exposure machine due to alignment failure.

Figure 16:
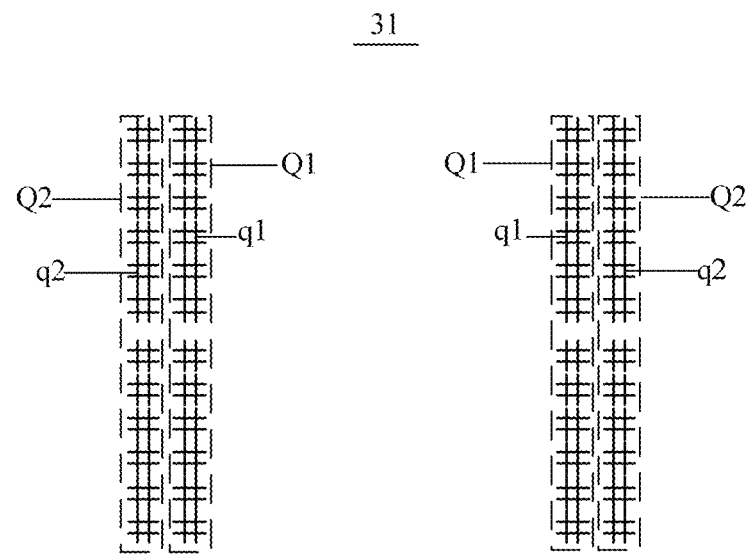
FIG. 16 is a diagram showing a patterned plating seed layer.

Therefore, in order to solve the problem that the alignment marks on the driving backplane cannot be reused, thereby resulting in the alignment failure during the pattern process for the first planarization layer, in the manufacture method provided by the embodiment of the present disclosure, the step S401 of forming a plating seed layer on the base substrate may include: forming the plating seed layer on the base substrate and patterning the plating seed layer. FIG. 16 shows a pattern of a patterned plating seed layer. As shown in FIG. 16, the patterned plating seed layer 31 includes: a plurality of first alignment marks q1 and a plurality of second alignment marks q2. In order to facilitate the alignment, the first alignment markers Q1 are located in a first alignment region Q1, and the second alignment markers Q2 are located in a second alignment region Q2. It should be noted that in FIG. 16, other patterns of the plating seed layer are omitted for the sake of more clearly showing the first alignment mark and the second alignment mark. In the actual plating seed layer may have other patterns.

Figure 17:
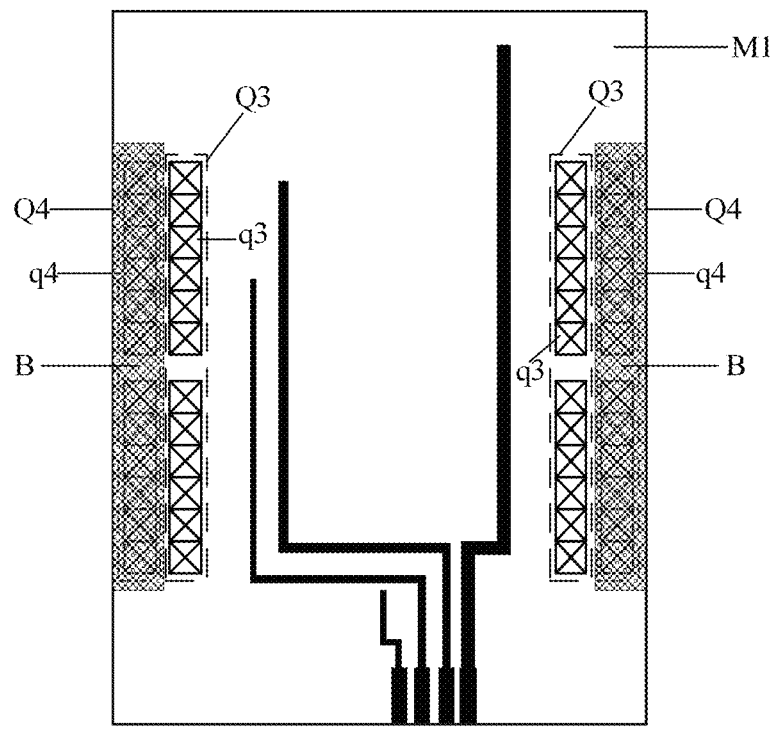
FIG. 17 is a schematic diagram showing a mask plate.

At step S401, patterning the photoresist layer includes: providing a mask plate. FIG. 17 is a schematic diagram showing a structure of a mask plate. Referring to FIGS. 16 and 17, the mask plate M1 includes: a plurality of third alignment marks q3 corresponding to the first alignment marks q1 respectively, and a plurality of fourth alignment marks q4 corresponding to the second alignment marks q2 respectively. In order to facilitate the alignment, the third alignment marks Q3 are located in the third alignment region Q3, and the fourth alignment marks Q4 are located in the fourth alignment region Q4. A position of the third alignment region Q3 corresponds to a position of the first alignment region Q I, and a position of the fourth alignment region Q4 corresponds to a position of the second alignment region Q2. It should be noted that FIG. 17 corresponds FIG. 11 which shows the schematic diagram for a plan structure of the driving backplane. The pattern of the mask plate is not limited herein, and in practical applications, the pattern of the mask plate may be set according to the specific structure of the driving backplane.

Continuing to referring to FIGS. 16 and 17, the exposure process may be performed on the photoresist layer by shielding the photoresist layer with a mask plate M1 During the exposure process for the photoresist layer, the fourth alignment marks q4 in the mask plate M1 are shielded by a shield plate B, that is, the fourth alignment region Q4 is shielded by the shield plate B, and the third alignment marks q3 in the mask plate M1 are aligned with the first alignment marks q1 in the plating seed layer 31.

Figure 18:
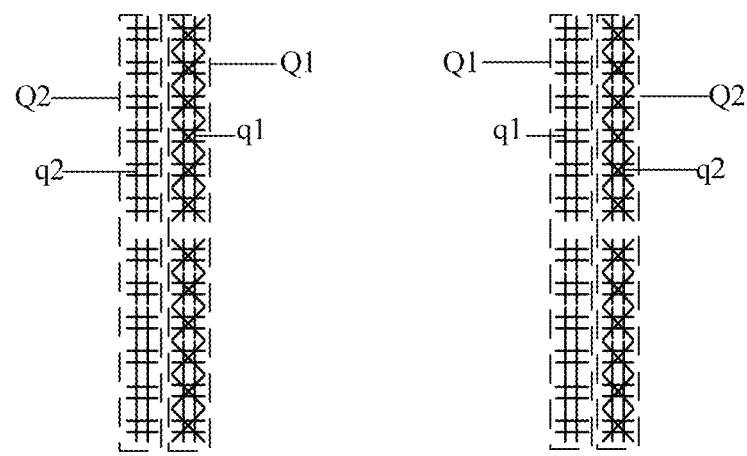
FIG. 18 is a diagram showing a plating seed layer after the first conductive layer is patterned.

FIG. 18 is a diagram showing the plating seed layer after the first conductive layer is patterned, as shown in FIG. 18, the first alignment marks q1 in the first alignment area Q1 are shielded. During the process of exposing the photoresist layer, since the fourth alignment marks in the mask plate are shielded by the shield plate, no other pattern is formed on the second alignment marks q2 of the plating seed layer 31, that is, the second alignment marks q2 are not shielded.

The step S402 of patterning the first planarization layer by using a mask plate which is the same as the mask plate used for patterning the photoresist layer includes the following steps.

Figure 19:
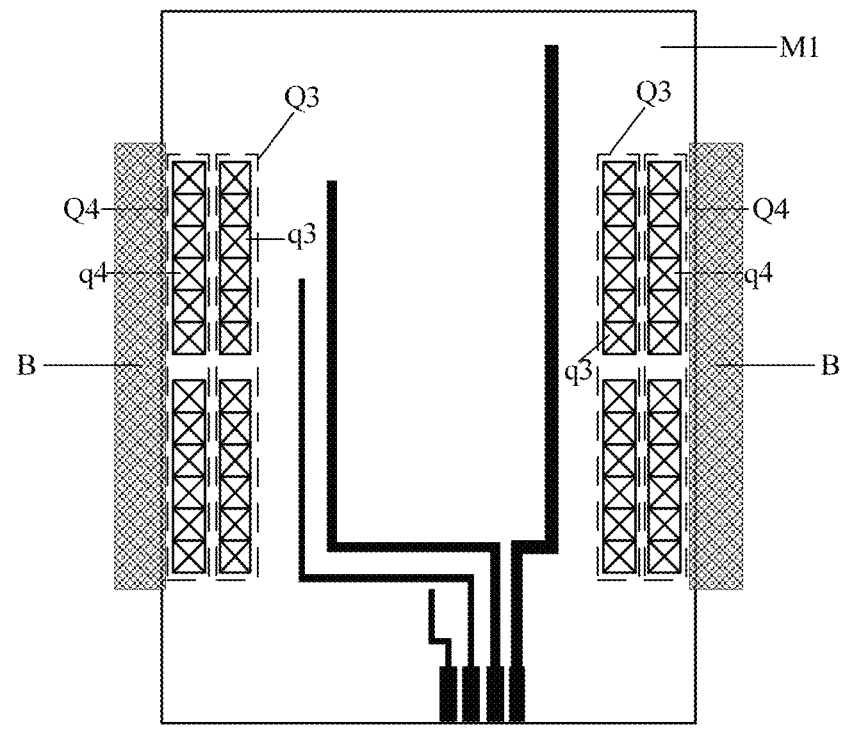
FIG. 19 is a schematic diagram showing a mask plate used for patterning a first planarization layer.

FIG. 19 is a schematic diagram showing a mask plate used in a process of patterning the first planarization layer. Referring to FIGS. 18 and 19, the exposure process is performed on the first planarization layer by shielding the first planarization layer with the mask plate 1141; and during the process of exposing the first planarization layer, the shield plate B is moved to expose the fourth alignment marks q4 in the mask plate M1, and the fourth alignment marks q4 in the mask plate M1 are aligned with the second alignment marks q2 in the plating seed layer 31.

In the embodiment of the present disclosure, two groups of alignment marks are respectively arranged in the mask plate and the driving backplane, namely, the first alignment marks and the second alignment marks are arranged in the driving backplane, and the third alignment marks corresponding to the first alignment marks and the fourth alignment marks corresponding to the second alignment marks are arranged in the mask plate, During the patterning of the first conductive layer, the fourth alignment marks in the mask plate are shielded, so that no other pattern is formed on the second alignment marks on the driving backplane. During the subsequent pattern process of the first planarization layer, the fourth alignment marks in the mask plate are aligned with the second alignment marks on the driving backplane, therefore an accurate alignment can be realized in the process of twice pattern processes respectively on the first conductive layer and the first planarization layer with the same mask plate.

It should be noted that, in FIG. 16 and FIG. 18, taking an example in which one first alignment region Q1 and one second alignment region Q2 are provided on both sides of the plating seed layer 31 respectively. In an implementation, the positions and the number of the first alignment region Q1 and the second alignment region Q2 may be set according to practical situations, which are not limited herein. In FIGS. 17 and 19, in order to show the position of the shield plate B for clarity, FIGS. 17 and 19 show the shield plate B in way of a translucent pattern. In an implementation, the shield plate B may block the light from the exposure machine. The shield plate B may be various objects capable of blocking light, such as a black curtain, a black adhesive tape, or a light-tight plastic plate.

According to the driving backplane, the manufacturing method thereof and the display panel provided by the embodiment of the present disclosure, the pattern of the first planarization layer is formed in the region outside the pattern of the first conductive layer, so that the resulted first planarization layer has a good thickness uniformity, and the height difference between the first conductive layer and the first planarization layer is small, so that the formed second planarization layer has a good thickness uniformity, and therefore, the planarization layers (i.e., the first planarization layer and the second planarization layer) between the first conductive layer and the second conductive layer have a good thickness uniformity. Since the second planarization layer has a good thickness uniformity, the difference between the actual size and the design value of the formed first via hole is smaller, thereby ensuring the coupling effect between the first conductive layer and the second conductive layer. In addition, the pattern of the first planarization layer is complementary to the pattern of the first conductive layer, therefore the first planarization layer may be patterned by using the same mask plate as the mask plate used for patterning the first conductive layer, so that one mask plate can be saved, and the manufacture cost can be lowered.

In the driving backplane provided in the embodiment of the present disclosure, the first planarization layer is disposed in the region outside the pattern of the first conductive layer on the base substrate. The first planarization layer having a good thickness uniformity may be formed during the manufacturing process. The height difference between the first conductive layer and the first planarization layer is small, so that the formed second planarization layer has a good thickness uniformity, and thus, the planarization layers (i.e., the first planarization layer and the second planarization layer) between the first conductive layer and the second conductive layer have a good thickness uniformity. Since the second planarization layer has a good thickness uniformity, the difference between the actual size and a design value of the first via hole in the second planarization layer is small, thereby ensuring the coupling effect between the first conductive layer and the second conductive layer. In addition, the pattern of the first planarization layer is complementary with the pattern of the first conductive layer, so that the first planarization layer can be patterned by using the same mask plate as the mask plate used for patterning the first conductive layer during the manufacture process. Compared with the related are in which a pattern process is performed on the planarization layer twice, one mask plate can be saved and the manufacture cost can be lowered.

An embodiment of the present disclosure further provides a display panel, which includes the driving backplane according to any one of above embodiments.

In the embodiment, the display panel further includes a plurality of light emitting diodes mounted on the driving backplane. Since the principle of solving the problems of the display panel is similar to that of the driving backplane, the implementation of the display panel can refer to the implementation of the driving backplane, and repeated content will not be described again. The light emitting diodes may be Micro Light Emitting Diodes (i.e., Mini LEDs and Micro LEDs). The driving backplane controls the light emitting diodes to emit light so as to display images.

The display panel employs the driving backplane in any one of above embodiments, so that the display quality of the display panel can be improved.

Figure 20:
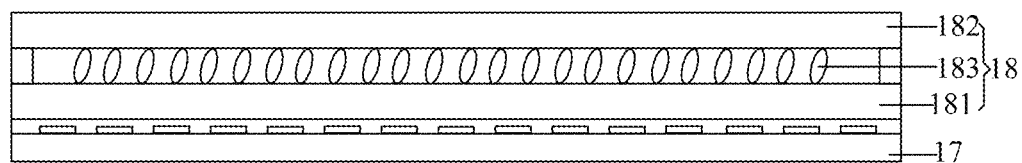
FIG. 20 is a schematic cross-sectional view showing a structure of a display panel according to an embodiment of the present disclosure.

An embodiment of the present disclosure further provides a display panel. As shown in FIG. 20, the display panel includes the driving backplane 17 according to any one of the embodiments, and further includes a liquid crystal cell 18. The liquid crystal cell 18 includes an array substrate 181 and a color filter substrate 182. The array substrate 181 and the color filter substrate 182 are aligned with each other to form a cell gap in which a liquid crystal 183 is filled therein. The driving backplane 17 is disposed on a side of the array substrate 181 distal to the color filter substrate 182, and the driving backplane 17 provides backlight for the liquid crystal cell 18.

The display panel employs the driving backplane according to any one of the embodiments, so that the display quality of the display panel can be improved.

The display panel provided by the embodiment of the present disclosure can be any product or component with a display function, such as an LCD panel, an LCD television, a Mini LED panel, a Mini LED television, a Micro LED panel, a Micro LED television, a display, a mobile phone, a navigator and the like.

It should be understood that the above implementations are merely exemplary embodiments for the purpose of illustrating the principles of the present disclosure, however, the present disclosure is not limited thereto. It will be apparent to those skilled in the art that various changes and modifications can be made without departing from the spirit and essence of the present disclosure, which are also to be regarded as the scope of the present disclosure.

What is claimed is:
1. A driving backplane, comprising:
a base substrate;
a first conductive layer on the base substrate;
a first planarization layer in a region of the base substrate outside a pattern of the first conductive layer;
a second planarization layer on a side of the first conductive layer and the first planarization layer distal to the base substrate;
a second conductive layer on a side of the second planarization layer distal to the base substrate, wherein an orthographic projection of the first conductive layer on the base substrate partially overlaps with an orthographic projection of the second conductive layer on the base substrate; and
a first insulation layer between the first planarization layer and the first conductive layer.

2. The driving backplane of claim 1, wherein
an orthographic projection of the first planarization layer on the base substrate overlaps with a region outside the orthographic projection of the first conductive layer on the base substrate.

3. The driving backplane of claim 1, wherein a difference between a thickness of the first planarization layer and a thickness of the first conductive layer is less than 1 μm.

4. The driving backplane of claim 3, wherein the thickness of the first planarization layer is less than or equal to the thickness of the first conductive layer.

5. The driving backplane of claim 4, wherein the first planarization layer has a thickness in a range from 1.8 μm to 7 μm.

6. The driving backplane of claim 1, wherein the first planarization layer comprises a photoresist material, and photosensitivity of the photoresist material of the first planarization layer is opposite to photosensitivity of a photoresist material used for forming the first conductive layer, or
the first planarization layer comprises a photoresist material, and photosensitivity of the photoresist material of the first planarization layer is the same as photosensitivity of a photoresist material used for forming the first conductive layer, or
the first planarization layer comprises an organic insulation material or an inorganic insulation material.

7. The driving backplane of claim 1, wherein the second planarization layer comprises a plurality of first via holes, and a pattern of the second conductive layer is electrically coupled to the pattern of the first conductive layer through the plurality of first via holes.

8. The driving backplane of claim 7, further comprising:
a third planarization layer on a side of the second conductive layer distal to the base substrate; and
a second insulation layer between the second conductive layer and the third planarization layer; wherein
the first insulation layer comprises a plurality of second via holes corresponding to the plurality of first via holes respectively,
the third planarization layer comprises a plurality of third via holes, and
the second insulation layer comprises a plurality of fourth via holes corresponding to the plurality of third via holes respectively.

9. A display panel, comprising the driving backplane of claim 1.

10. A driving backplane, comprising:
a base substrate;
a first conductive layer on the base substrate;
a first planarization layer in a region of the base substrate outside a pattern of the first conductive layer;
a second planarization layer on a side of the first conductive layer and the first planarization layer distal to the base substrate;
a second conductive layer on a side of the second planarization layer distal to the base substrate, wherein an orthographic projection of the first conductive layer on the base substrate partially overlaps with an orthographic projection of the second conductive layer on the base substrate;
a first protective layer between the first conductive layer and the second conductive layer, and
a second protective layer on a side of the second conductive layer distal to the base substrate, wherein
a pattern of the first protective layer is consistent with the pattern of the first conductive layer, and
a pattern of the second protective layer is consistent with a pattern of the second conductive layer.

11. A method for manufacturing a driving backplane, comprising:
forming a pattern of a first conductive layer on a base substrate;
forming a pattern of a first planarization layer in a region of the base substrate outside the pattern of the first conductive layer;
forming a pattern of a second planarization layer on the first conductive layer and the first planarization layer; and
forming a pattern of a second conductive layer on the second planarization layer, wherein
an orthographic projection of the first conductive layer on the base substrate partially overlaps an orthographic projection of the second conductive layer on the base substrate,
after forming the pattern of the first conductive layer on the base substrate and before forming the pattern of the first planarization layer in the region outside the pattern of the first conductive layer, the method further comprises: forming a first insulation layer between the first planarization layer and the first conductive layer.

12. The method of claim 11, wherein
the first planarization layer and the first conductive layer are formed by using a same mask, and
the first planarization layer and the first conductive layer are formed by using photoresist materials with different properties.

13. The method of claim 12, wherein
forming the pattern of the first conductive layer comprises:
depositing a first metal film layer on the base substrate;
coating a positive photoresist film, performing exposure and development processes on the positive photoresist film by using a mask plate to remove the positive photoresist film not shielded by the mask plate and remain the positive photoresist film shielded by the mask plate; and
etching the first metal film layer not covered by the positive photoresist film to form the pattern of the first conductive layer; wherein
the pattern of the first conductive layer is consistent with a pattern of the mask plate, and forming the pattern of the first planarization layer comprises:
coating a negative photoresist film on the base substrate on which the first conductive layer is formed; and
performing exposure and development processes on the negative photoresist film by using the mask plate used for forming the first conductive layer to remove the negative photoresist film shielded by the mask plate and remain the negative photoresist film not shielded by the mask plate, so as to form the pattern of the first planarization layer; wherein
the pattern of the first planarization layer is a pattern of the reserved negative photoresist film not shielded by the mask plate, and an orthographic projection of the first planarization layer on the base substrate overlaps with a region outside the orthographic projection of the first conductive layer on the base substrate.

14. The method of claim 11, wherein forming the pattern of the first conductive layer on the base substrate comprises:
forming a plating seed layer on the base substrate;
forming a photoresist layer on the plating seed layer;

patterning the photoresist layer to obtain a pattern of the photoresist layer, such that an orthographic projection of the pattern of the photoresist layer on the base substrate overlaps with a region outside an orthographic projection of the pattern of the first conductive layer to be formed on the base substrate; and forming the pattern of the first conductive layer through an electroplating process by using the pattern of the photoresist layer as a mask, and forming the pattern of the first planarization layer in the region outside the pattern of the first conductive layer comprises:

forming the first planarization layer on the first conductive layer by using a photoresist material having the same photosensitivity as photosensitivity of the photoresist layer; and patterning the first planarization layer by using a same mask plate used for forming the pattern of the photoresist layer.

15. The method of claim 11, wherein forming the pattern of the first conductive layer on the base substrate comprises:

forming a plating seed layer on the base substrate;

forming a photoresist layer on the plating seed layer;

patterning the photoresist layer to obtain a pattern of the photoresist layer consistent with the pattern of the first conductive layer to be formed;

patterning the plating seed layer to obtain a pattern of the plating seed layer; and forming the first conductive layer through an electroplating process on the base substrate, and forming the pattern of the first planarization layer in the region outside the pattern of the first conductive layer comprises:

forming the first planarization layer on the first conductive layer by using a photoresist material having photosensitivity opposite to photosensitivity of a material of the photoresist layer; and patterning the first planarization layer by using a same mask plate used for forming the pattern of the photoresist layer.

16. The method of claim 11, wherein forming the pattern of the second planarization layer comprises:

patterning the second planarization layer to obtain a plurality of first via holes, the pattern of the second conductive layer being electrically coupled to the pattern of the first conductive layer through the plurality of first via holes, and after patterning the second planarization layer and before forming the pattern of the second conductive layer on the second planarization layer, the method further comprises: patterning the first insulation layer by using the pattern of the second planarization layer as a mask to obtain a plurality of second via holes corresponding to the plurality of first via holes respectively.

17. The method of claim 16, wherein after forming the pattern of the second conductive layer on the second planarization layer, the method further comprises:

forming a second insulation layer on the second conductive layer;

forming a third planarization layer on the second insulation layer;

patterning the third planarization layer to obtain a plurality of third via holes; and patterning the second insulation layer by using the third planarization layer as a mask to obtain a plurality of fourth via holes corresponding to the plurality of third via holes respectively.

18. The method of claim 11, wherein after forming the pattern of the first conductive layer on the base substrate and before forming the pattern of the first planarization layer in the region outside the pattern of the first conductive layer, the method further comprises:

forming a pattern of a first protective layer on the first conductive layer, the pattern of the first protective layer being consistent with the pattern of the first conductive layer;

after forming the pattern of the second conductive layer on the second planarization layer, the method further comprises:

forming a pattern of a second protective layer on the second conductive layer, the pattern of the second protective layer being consistent with the pattern of the second conductive layer.

19. The method of claim 12, wherein the forming the plating seed layer on the base substrate comprises:

forming the plating seed layer on the base substrate; and patterning the plating seed layer, such that the patterned plating seed layer comprises a plurality of first alignment marks and a plurality of second alignment marks, and patterning the photoresist layer comprises:

providing a mask plate comprising a plurality of third alignment marks respectively corresponding to the plurality of first alignment marks, and a plurality of fourth alignment marks respectively corresponding to the plurality of second alignment marks; and performing an exposure process on the photoresist layer by shielding the photoresist layer with the mask plate, wherein during the exposure process on the photoresist layer, the plurality of fourth alignment marks of the mask plate are shielded by a shield plate, and the plurality of third alignment marks of the mask plate are aligned with the plurality of first alignment marks of the plating seed layer, and patterning the first planarization layer by using the same mask plate used for forming the pattern of the photoresist layer comprises:

performing an exposure process on the first planarization layer by shielding the first planarization layer with the mask plate, wherein during the exposure process on the first planarization layer, the shield plate is removed to expose the plurality of fourth alignment marks of the mask plate, and the plurality of fourth alignment marks of the mask plate are aligned with the plurality of second alignment marks of the plating seed layer.

* * * * *